(12) United States Patent
Davis et al.

(10) Patent No.: US 11,327,540 B2
(45) Date of Patent: May 10, 2022

(54) ASSEMBLY AND METHOD FOR COOLING

(71) Applicant: FORCED PHYSICS LLC, Scottsdale, AZ (US)

(72) Inventors: Scott Davis, Fountain Hills, AZ (US); David Binger, Scottsdale, AZ (US)

(73) Assignee: Forced Physics LLC, Scottsdale, AZ (US)

( * ) Notice: Subject to any disclaimer, the term of this patent is extended or adjusted under 35 U.S.C. 154(b) by 531 days.

(21) Appl. No.: 16/426,940

(22) Filed: May 30, 2019

(65) Prior Publication Data

US 2019/0346892 A1 Nov. 14, 2019

Related U.S. Application Data

(62) Division of application No. 15/119,412, filed as application No. PCT/US2015/016369 on Feb. 18, 2015, now Pat. No. 10,379,582.

(60) Provisional application No. 61/941,313, filed on Feb. 18, 2014.

(51) Int. Cl.
  *G06F 1/20* (2006.01)
  *F28D 9/00* (2006.01)
  *H05K 7/20* (2006.01)

(52) U.S. Cl.
  CPC .............. *G06F 1/20* (2013.01); *F28D 9/0025* (2013.01); *H05K 7/20172* (2013.01); *H05K 7/20736* (2013.01)

(58) Field of Classification Search
  CPC ......... F28F 3/025; F28F 2215/00; G06F 1/20; F28D 9/0025; H05K 7/20172; H05K 7/20736
  See application file for complete search history.

(56) References Cited

U.S. PATENT DOCUMENTS

| | | | |
|---|---|---|---|
| 4,332,293 A | * | 6/1982 | Hiramatsu .............. F28F 1/128 |
| | | | 165/153 |
| 4,586,565 A | | 5/1986 | Hallström et al. |
| 4,898,234 A | | 2/1990 | McGovern et al. |

(Continued)

FOREIGN PATENT DOCUMENTS

| DE | 2630551 A1 | 1/1977 |
|---|---|---|
| JP | H01244285 A | 9/1989 |

(Continued)

OTHER PUBLICATIONS

Extended Search Report for European Application No. 19170922.9 issued by the European Patent Office, dated Aug. 14, 2019.

(Continued)

*Primary Examiner* — Tho V Duong
(74) *Attorney, Agent, or Firm* — Finnegan, Henderson, Farabow, Garrett & Dunner, LLP

(57) ABSTRACT

Materials, components, assemblies, and methods consistent with the disclosure are directed to the fabrication and use of sheets of material to provide channels for cooling through the flow of gas. An assembly for cooling can include a stack of alternating first and second blades, where each blade exhibits at least a first edge, a beveled edge, and a bend, the bend defining at least a first region and a second region, where the first region is substantially flat and bordered by the edge, the beveled edge, and the bend. An assembly can also include a sheet with folds to provide channels.

17 Claims, 32 Drawing Sheets

(56) References Cited

U.S. PATENT DOCUMENTS

| | | | |
|---|---|---|---|
| 6,874,345 B2* | 4/2005 | Stoynoff, Jr. | B21D 31/046 |
| | | | 72/186 |
| 7,225,859 B2* | 6/2007 | Mochizuki | F02G 1/055 |
| | | | 165/10 |
| 2003/0075311 A1 | 4/2003 | Seaba et al. | |
| 2003/0093900 A1 | 5/2003 | Huguet et al. | |
| 2004/0112579 A1 | 6/2004 | Strahle | |
| 2006/0002088 A1* | 1/2006 | Bezama | F28F 3/04 |
| | | | 361/702 |
| 2006/0096737 A1 | 5/2006 | Kimura | |
| 2007/0175617 A1 | 8/2007 | Brost | |
| 2008/0023178 A1 | 1/2008 | Suzuki et al. | |
| 2009/0008071 A1 | 1/2009 | Miao | |
| 2009/0283246 A1 | 11/2009 | Chen | |
| 2010/0132929 A1 | 6/2010 | Fernandez | |
| 2013/0075073 A1 | 3/2013 | Wang et al. | |
| 2014/0360707 A1* | 12/2014 | Cho | F28F 13/06 |
| | | | 165/165 |

FOREIGN PATENT DOCUMENTS

| | | | | |
|---|---|---|---|---|
| JP | H11254047 A | | 9/1999 | |
| JP | 11311488 A | * | 11/1999 | ............... F28F 1/126 |
| JP | 2003083691 A | * | 3/2003 | ............... F28F 1/128 |
| JP | 2005026642 A | | 1/2005 | |
| JP | 2010175245 A | | 8/2010 | |
| RU | 2012/130428 A | | 1/2014 | |
| WO | WO 02/10660 A1 | | 2/2002 | |
| WO | WO 2005/004235 A1 | | 1/2005 | |
| WO | WO 2007/064572 A1 | | 6/2007 | |
| WO | WO 2011/025020 A1 | | 3/2011 | |

OTHER PUBLICATIONS

Extended Search Report for European Application No. 15752528.8 from the European Patent Office, dated Apr. 16, 2018.
Office Action in counterpart Japanese Application No. 2016-569583, dated Jun. 26, 2018.
International Search Report from the ISA/US for International Application No. PCT/US2015/016369 dated May 20, 2015.

* cited by examiner

FIG. 26     An FP Architecture supercomputer with two electrical groups and a total of 6,144 nodes.

This closer view shows how the blades are stacked.

A pair of blades is mounted above and below an array of Model 6 coolers.

FIG. 29  Model 6 coolers with the top blade removed.

FIG. 30    The side rail manifolds feed exhaust air back to the rear manifolds.

The Model 6 Cooler is 1.25 inches thick.

An example of an industrial blower

ASSEMBLY AND METHOD FOR COOLING

This application is a divisional of U.S. patent application Ser. No. 15/119,412, filed Aug. 17, 2016, which is a national stage application of PCT/US2015/016369, filed Feb. 18, 2015, which itself claims the benefit of U.S. Provisional Patent Application No. 61/941,313, filed Feb. 18, 2014, the contents of each of which are herein incorporated by reference. This application is related to PCT Application No. PCT/US2013/061887, filed Sep. 26, 2013, which itself claims the benefit of U.S. Provisional Application No. 61/708,619, filed Oct. 1, 2012, the contents of each of which are herein incorporated by reference.

TECHNICAL FIELD

Materials, components, assemblies, and methods consistent with the present disclosure are directed to the fabrication and use of channels with a gas, where the channels are configured to control the temperature of the gas.

BACKGROUND

A volume of fluid, such as air, can be characterized by a temperature and pressure. When considered as a collection of constituent particles, comprising, for example, molecules of oxygen and nitrogen, the volume of fluid at a given temperature can be understood as a distribution of constituent particle speeds. This distribution can be characterized, generally, by an average speed which can bear a relationship with the temperature of the gas.

The internal atomic and molecular structure of constituent particles, which can provide a range of accessible internal energy states, can also affect the temperature distribution of the gas. The range of accessible internal energy states associated with an atom or molecule, in turn, can be affected by the geometry and properties of its surroundings.

SUMMARY

In an aspect, an assembly for cooling can be configured to accommodate a flow of a gas through a series of channels. The assembly can include a stack of alternating first blades and second blades. Each first blade can exhibit at least a first edge of the first blade, a beveled edge of the first blade, and a bend of the first blade, the bend of the first blade defining at least a first region of the first blade and a second region of the first blade. The first region of the first blade can be substantially flat and bordered by a first perimeter, at least a first portion of the first perimeter being the first edge of the first blade, a second portion of the first perimeter being the beveled edge of the first blade, and a third portion of the first perimeter being the bend of the first blade. The first portion of the first perimeter can be continuous with the second portion of the first perimeter, and the second portion of the first perimeter can be continuous with the third portion of the first perimeter, such that the first portion of the first perimeter is substantially parallel to the third portion of the first perimeter, and the first portion of the first perimeter is separated from the parallel third portion of the first perimeter by a first distance. The bend of the first blade can be configured to exhibit a first elevation value perpendicular to the first region of the first blade that is less than approximately 0.5 mm. Alternatively, the first elevation value can be less than approximately any one of: 0.45 mm, 0.4 mm, 0.39 mm, 0.38 mm, 0.37 mm, 0.36 mm, 0.35 mm, 0.34 mm, 0.33 mm, 0.32 mm, 0.31 mm, 0.3 mm, 0.29 mm, 0.28 mm, 0.27 mm, 0.26 mm, 0.25 mm, 0.24 mm, 0.23 mm, 0.22 mm, 0.21 mm, 0.2 mm, 0.19 mm, 0.18 mm, 0.17 mm, 0.16 mm, 0.15 mm, 0.14 mm, 0.13 mm, 0.12 mm, 0.11 mm, 0.1 mm, 0.09 mm, 0.08 mm, 0.07 mm, 0.06 mm, 0.05 mm, 0.04 mm, 0.03 mm, 0.02 mm, and 0.01 mm. Each second blade can exhibit at least a first edge of the second blade, a beveled edge of the second blade, and a bend of the second blade, the bend of the second blade defining at least a first region of the second blade and a second region of the second blade. The first region of the second blade can be substantially flat and bordered by a second perimeter, at least a first portion of the second perimeter being the first edge of the second black, a second portion of the second perimeter being the beveled edge of the second blade, and a third portion of the second perimeter being the bend of the second blade. The first portion of the second perimeter can be continuous with the second portion of the second perimeter, and the second portion of the second perimeter can be continuous with the third portion of the second perimeter, such that the first portion of the second perimeter is substantially parallel to the third portion of the second perimeter, and the first portion of the second perimeter is separated from the parallel third portion of the second perimeter by the first distance. The bend of the second blade can be configured to exhibit a second elevation value perpendicular to the first region of the second blade that is approximately the first elevation value. The stack of alternating first blades and second blades can be configured such that, for each first blade and an adjacent second blade, the first portion of the first perimeter of each first blade is aligned with the third portion of the second perimeter of the adjacent second blade; the second portion of the first perimeter of each first blade is aligned with the second portion of the second perimeter of the adjacent second blade; and the third portion of the first perimeter of each first blade is aligned with the first portion of the second perimeter of the adjacent second blade; the stack of alternating first blades and second blades forming the series of channels for the flow of gas.

In another aspect, an assembly for cooling can include a folded sheet, where the folded sheet can exhibit a beveled edge, at least a first fold, and at least a second fold. In an aspect, the first fold and a first portion of the beveled edge can form a portion of a perimeter to a first region; the first fold, a second portion of the beveled edge, and the second fold can form a portion of a perimeter to a second region, where the first portion of the beveled edge is continuous with the second portion of the beveled edge. Further, the second fold and a third portion of the beveled edge can form a portion of a perimeter to a third region, where the second portion of the beveled edge is continuous with the third portion of the beveled edge. In an aspect, the first region of the folded sheet can be substantially flat, the second region of the folded sheet can be substantially flat, and the third region of the folded sheet can be substantially flat, and the first fold can be separated from the second fold by a first distance. Further, the first fold can be configured to present a first non-zero acute angle between the first portion of the beveled edge and the second portion of the beveled edge such that the second fold is elevated from the substantially flat first region by a value that is less than approximately one of a set of values consisting of: 0.5 mm, 0.45 mm, 0.4 mm, 0.39 mm, 0.38 mm, 0.37 mm, 0.36 mm, 0.35 mm, 0.34 mm, 0.33 mm, 0.32 mm, 0.31 mm, 0.3 mm, 0.29 mm, 0.28 mm, 0.27 mm, 0.26 mm, 0.25 mm, 0.24 mm, 0.23 mm, 0.22 mm, 0.21 mm, 0.2 mm, 0.19 mm, 0.18 mm, 0.17 mm, 0.16 mm, 0.15 mm, 0.14 mm, 0.13 mm, 0.12 mm, 0.11 mm, 0.1 mm, 0.09 mm, 0.08 mm, 0.07 mm, 0.06 mm, 0.05 mm, 0.04 mm, 0.03 mm, 0.02 mm, and 0.01 mm. Further still, the second fold can be configured to present a second non-zero acute angle between the third portion of the beveled edge and the second portion of the beveled edge such that the second non-zero acute angle is approximately the first non-zero acute angle. In an aspect, the folded sheet can be configured to present a series of channels for a flow of gas.

In another aspect, a method for forming an assembly for cooling can include providing a stack of alternating first blades and second blades. Providing a first blade can include forming a first edge of the first blade, forming a beveled edge of the first blade, and forming a bend of the first blade, the bend of the first blade defining at least a first region of the first blade and a second region of the first blade. The first region of the first blade can be substantially flat and bordered by a first perimeter, at least a first portion of the first perimeter being the first edge of the first blade, a second portion of the first perimeter being the beveled edge of the first blade, and a third portion of the first perimeter being the bend of the first blade. The first portion of the first perimeter can be continuous with the second portion of the first perimeter, and the second portion of the first perimeter can be continuous with the third portion of the first perimeter, such that the first portion of the first perimeter is substantially parallel to the third portion of the first perimeter, and the first portion of the first perimeter is separated from the parallel third portion of the first perimeter by a first distance. The bend of the first blade can be formed to exhibit a first elevation value perpendicular to the first region of the first blade that is less than approximately 0.5 mm. Alternatively, the first elevation value can be less than approximately any one of: 0.45 mm, 0.4 mm, 0.39 mm, 0.38 mm, 0.37 mm, 0.36 mm, 0.35 mm, 0.34 mm, 0.33 mm, 0.32 mm, 0.31 mm, 0.3 mm, 0.29 mm, 0.28 mm, 0.27 mm, 0.26 mm, 0.25 mm, 0.24 mm, 0.23 mm, 0.22 mm, 0.21 mm, 0.2 mm, 0.19 mm, 0.18 mm, 0.17 mm, 0.16 mm, 0.15 mm, 0.14 mm, 0.13 mm, 0.12 mm, 0.11 mm, 0.1 mm, 0.09 mm, 0.08 mm, 0.07 mm, 0.06 mm, 0.05 mm, 0.04 mm, 0.03 mm, 0.02 mm, and 0.01 mm. Providing each second blade can include forming a first edge of the second blade, forming a beveled edge of the second blade, and forming a bend of the second blade, the bend of the second blade defining at least a first region of the second blade and a second region of the second blade. The first region of the second blade can be substantially flat and bordered by a second perimeter, at least a first portion of the second perimeter being the first edge of the second blade, a second portion of the second perimeter being the beveled edge of the second blade, and a third portion of the second perimeter being the bend of the second blade. The first portion of the second perimeter can be continuous with the second portion of the second perimeter, and the second portion of the second perimeter can be continuous with the third portion of the second perimeter, such that the first portion of the second perimeter is substantially parallel to the third portion f the second perimeter, and the first portion of the second perimeter is separated from the parallel third portion of the second perimeter by the first distance. The bend of the second blade can be formed to exhibit a second elevation value perpendicular to the first region of the second blade that is approximately the first elevation value. The stack of alternating first blades and second blades can be provided such that, for each first blade and an adjacent second blade, the first portion of the first perimeter of each first blade is aligned with the third portion of the second perimeter of the adjacent second blade; the second portion of the first perimeter of each first blade is aligned with the second portion of the second perimeter of the adjacent second blade; and the third portion of the first perimeter of each first blade is aligned with the first portion of the second perimeter of the adjacent second blade.

In a further aspect, a method for forming an assembly for cooling can include providing a sheet the folding, where the sheet exhibits a beveled edge, a first face, and a second face, the second face being on an opposite side of the sheet from the first face. The method can also include providing a plurality of spacers, each spacer configured to exhibit a substantially rectangular first face and a substantially rectangular second face, the substantially rectangular second face defining a second plane that is at a non-zero acute angle to a first plane defined by the substantially rectangular first face, each spacer further configured to present a wedge-like cross-section along an axis parallel to a surface of the first plane and a surface of the second plane, each spacer further configured to exhibit an edge defined by an intersection of the substantially rectangular first face with the substantially rectangular second face. The method can also include placing at least a first spacer from the plurality of spacers adjacent to the sheet such that at least a portion of the first face of the first spacer is flush with a first portion of the first face of the sheet, forming a first fold in the sheet along the edge of the first spacer, where the first fold is configured to place a second portion of the first face of the sheet flush with at least a portion of the second face of the first spacer, placing at least a second spacer from the plurality of spacers adjacent to the sheet such that at least a portion of the second face of the second spacer is flush with a first portion of the second face of the sheet, the first portion of the second face of the sheet being on the opposite side of the second portion of the first face of the sheet, where the edge of the second spacer is substantially parallel to the edge of the first spacer and separated by a first distance. The method can also include forming a second fold in the sheet along the edge of the second spacer, where the second fold is configured to place a second portion of the second face of the sheet flush with at least a portion of the first face of the second spacer, and removing the first spacer and the second spacer from the folded sheet. Consistent with this embodiment, the first fold and a first portion of the beveled edge can form a portion of a perimeter to a first region; and the first fold, a second portion of the beveled edge, and the second fold can form a portion of a perimeter to a second region, where the first portion of the beveled edge is continuous with the second portion of the beveled edge. In addition, the second fold and a third portion of the beveled edge form a portion of a perimeter to a third region, where the first region of the folded sheet is substantially flat, the second region of the folded sheet is substantially flat, and the third region of the folded sheet is substantially flat. In addition, the first fold can be separated from the second fold by approximately the first distance; and the first fold can be configured to present approximately the non-zero acute angle between the first portion of the beveled edge and the second portion of the beveled edge such that the second fold is elevated from the substantially flat first region by a value that is less than approximately one of the following set of values: 0.5 mm, 0.45 mm, 0.4 mm, 0.39 mm, 0.38 mm, 0.37 mm, 0.36 mm, 0.35 mm, 0.34 mm, 0.33 mm, 0.32 mm, 0.31 mm, 0.3 mm, 0.29 mm, 0.28 mm, 0.27 mm 0.26 mm, 0.25 mm, 0.24 mm, 0.23 mm, 0.22 mm, 0.21 mm, 0.2 mm, 0.19 mm, 0.18 trim, 0.17 mm, 0.16 mm, 0.15 mm, 0.14 mm, 0.13 mm, 0.12 mm, 0.11 mm, 0.1 mm, 0.09 mm, 0.08 mm, 0.07 mm, 0.06 mm, 0.05 mm, 0.04 mm, 0.03 mm, 0.02 mm, and 0.01 mm. Further, the second fold can be configured to present approximately the non-zero acute angle between the third portion of the beveled edge and the second portion of the beveled edge. Further still, the folded sheet can be configured to present a series of channels for a flow of gas.

Additional objects and advantages of the disclosure will be set firth in part in the description which follows, and in part will be obvious from the description, or may be learned by practice of embodiments consistent with the disclosure. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

DESCRIPTION OF THE EMBODIMENTS

Reference will now be made in detail the present embodiments (exemplary embodiments) of the disclosure, characteristics of which are illustrated in the accompanying drawings. Wherever possible, the same reference numbers will be used throughout the drawings to refer to the same or like parts.

Figure 1:
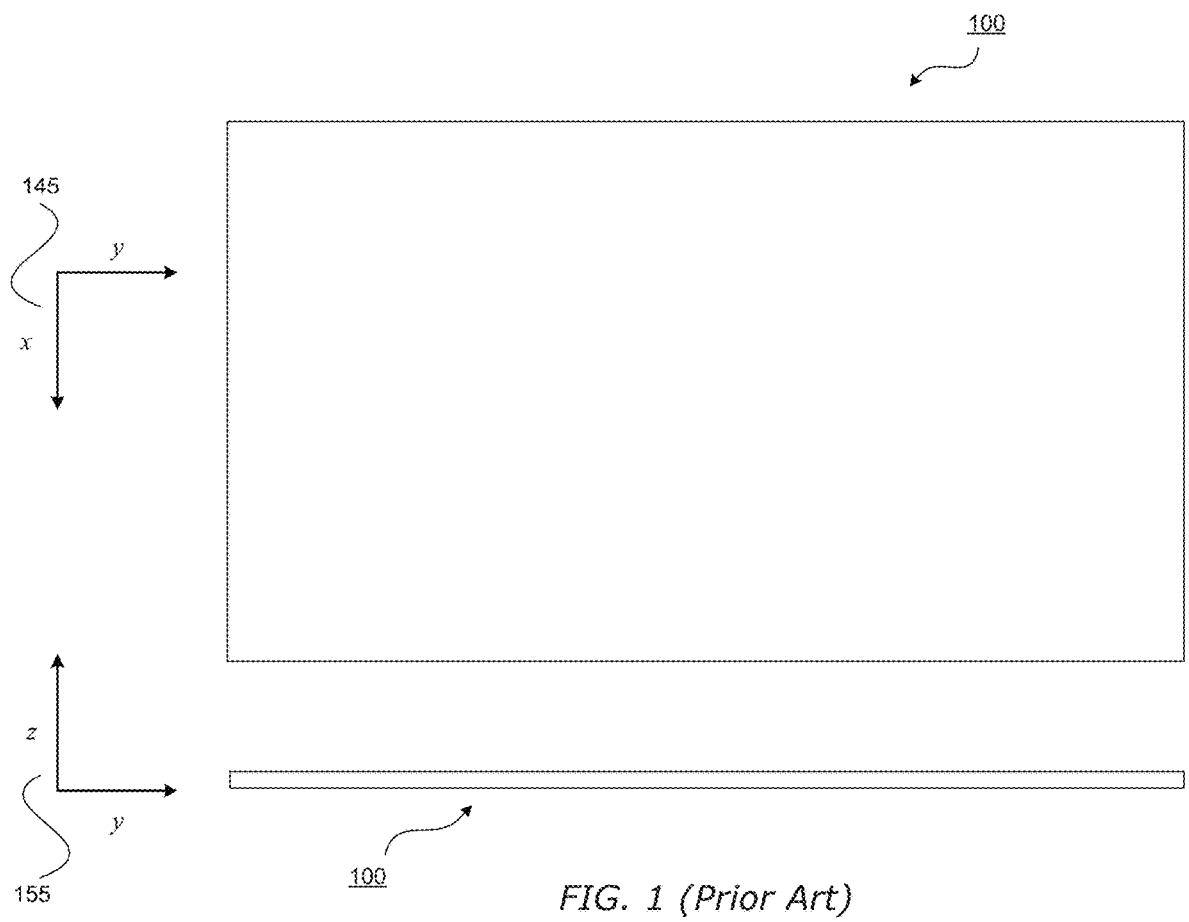
FIG. 1 depicts two views of an exemplary sheet for forming a blade.

FIG. 1 depicts two views of a thermally conducting sheet 100 for forming a blade consistent with the current disclosure. The lower portion of FIG. 1 depicts an "edge" view of the sheet 100, and the upper portion of FIG. 1 depicts a "top" view of the sheet 100. For reference, axis 145 assigns a "y"-direction and an "x"-direction to the figure in the upper portion, and axis 155 assigns a "y"-direction and a "z"-direction to the figure in the lower portion. The material of the sheet 100 can include any thermally conductive material, such as alloys of copper, aluminum, silver, gold, tin, brass, bronze, steel, or anodized aluminum, and sheet 100 can also include a coating, such as titanium nitride, silicon carbide, diamond, chrome, platinum, tin, tungsten, or gold.

As illustrated in FIG. 1, the shape of the sheet 100 can be substantially rectangular. However, the depicted shape is not limiting. The width of the sheet 100 along they-axis can be approximately 10 m or less, such as any value between approximately 10 m and approximately 1 mm (and preferably approximately 25.4 mm), or any value less than approximately 1 mm. The length of sheet 100 along the x-axis can be approximately 1 m or less, such as any value between approximately 1 m and approximately 0.5 mm (and preferably approximately 12.7 mm), or any value less than approximately 0.5 mm. The thickness of sheet 100 can be approximately 25 mm or less, such as any value between approximately 25 mm and approximately 0.025 mm (and preferably approximately 0.1778 mm), or any value less than approximately 0.025 mm.

Figure 2:
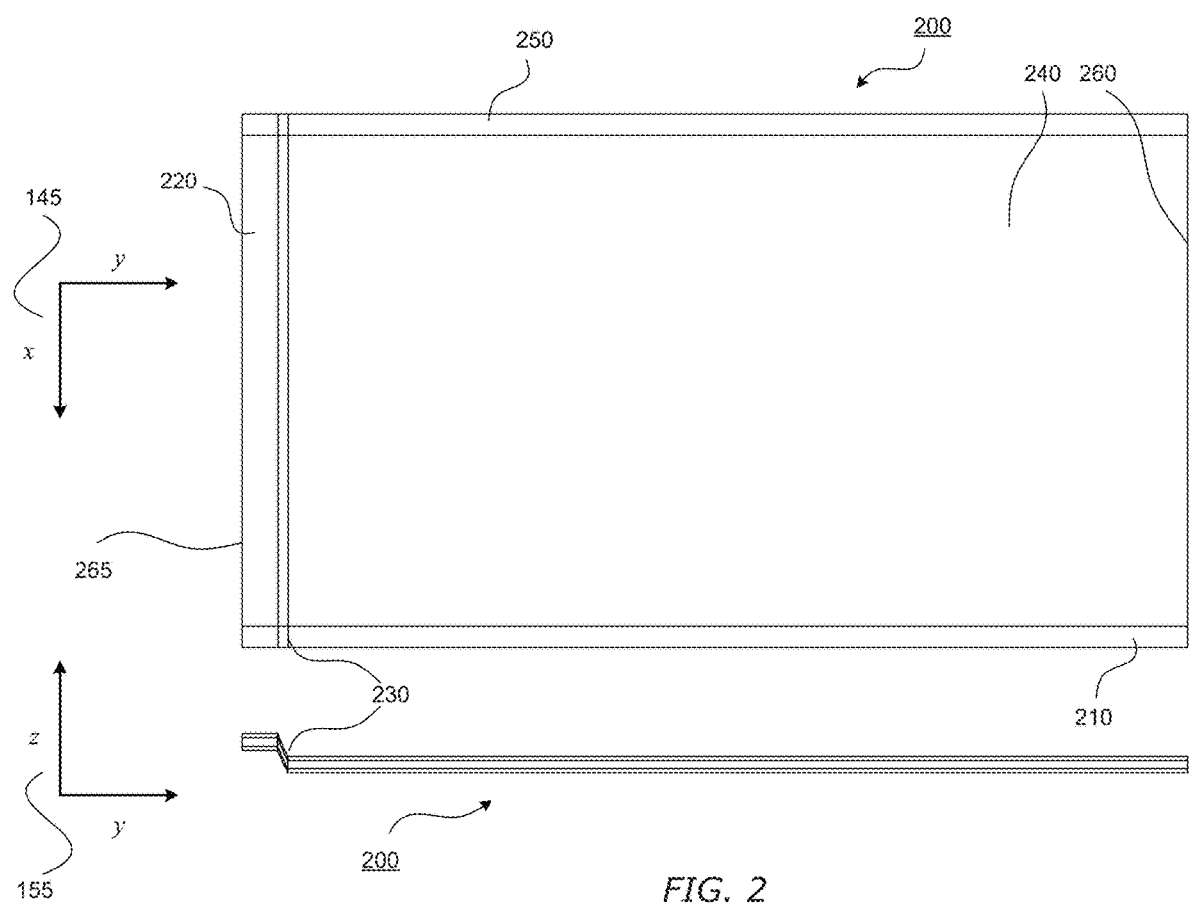
FIG. 2 depicts two views of a blade consistent with the current disclosure.
Figure 3:
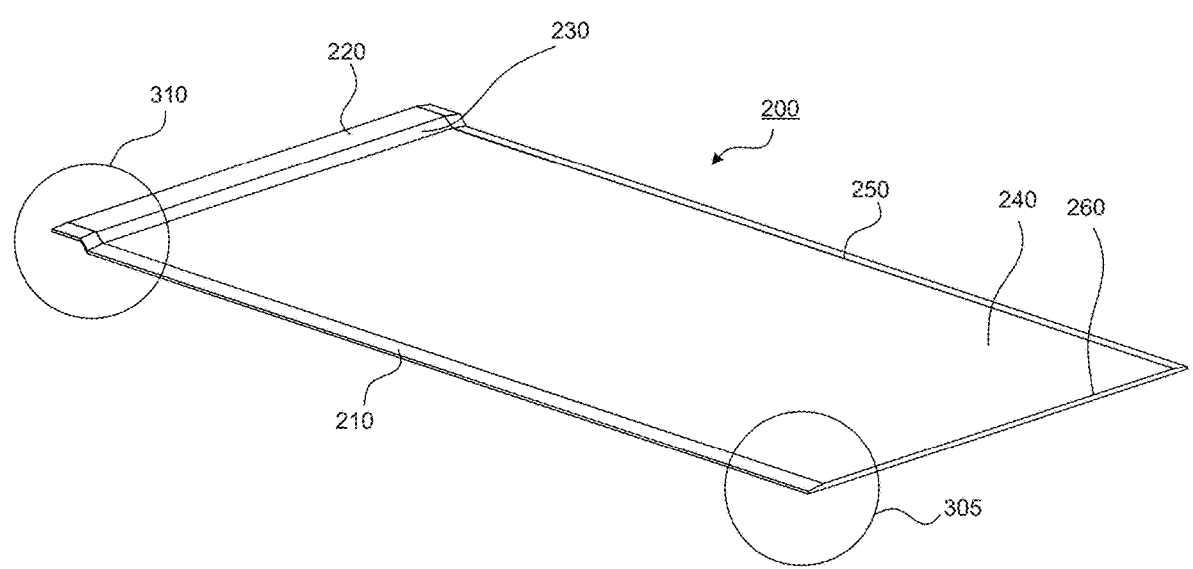
FIG. 3 depicts a perspective view of the blade of FIG. 2.
Figure 4:
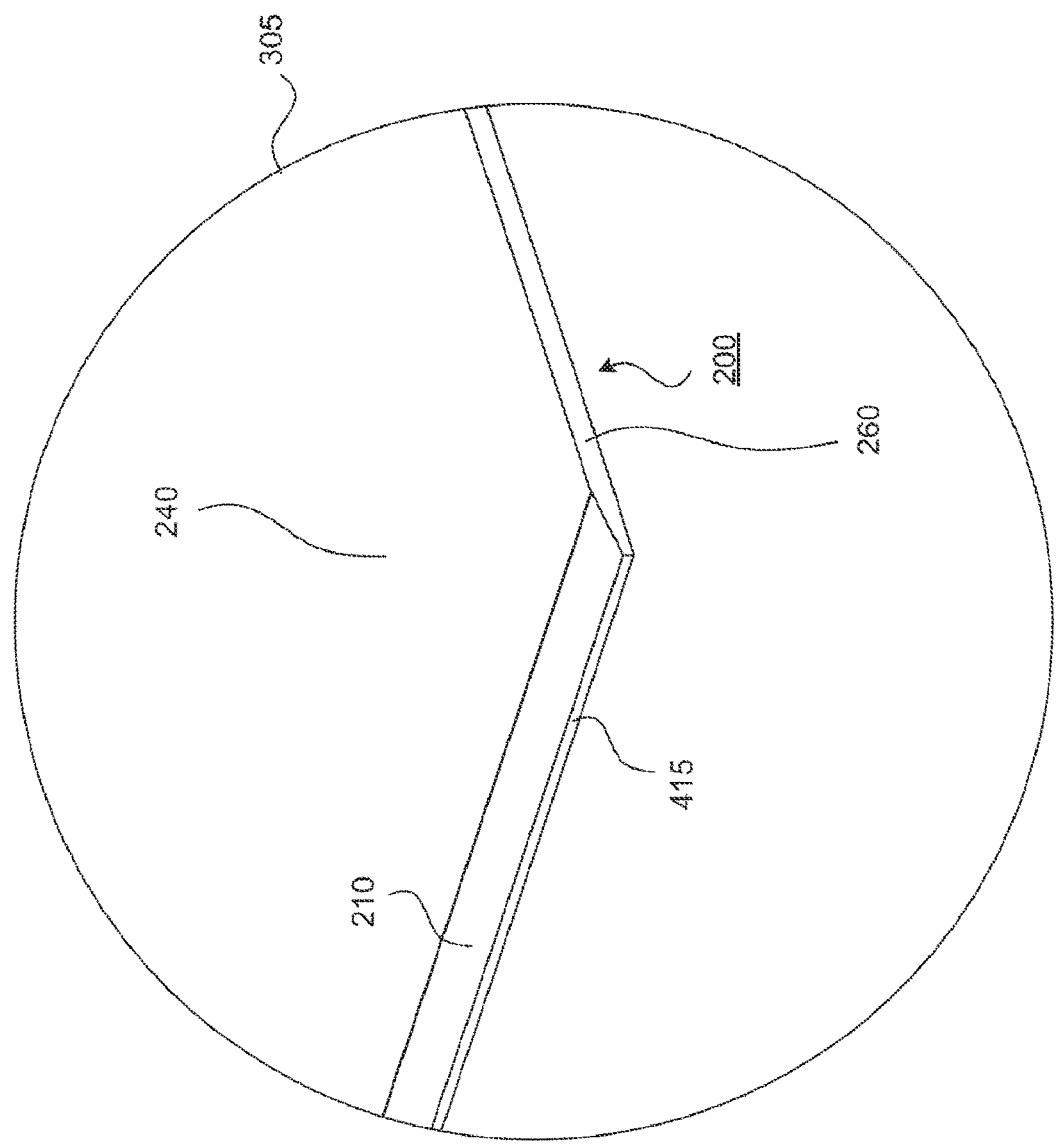
FIGS. 4 and 5 depict magnified views of portions of the blade of FIG. 3.
Figure 5:
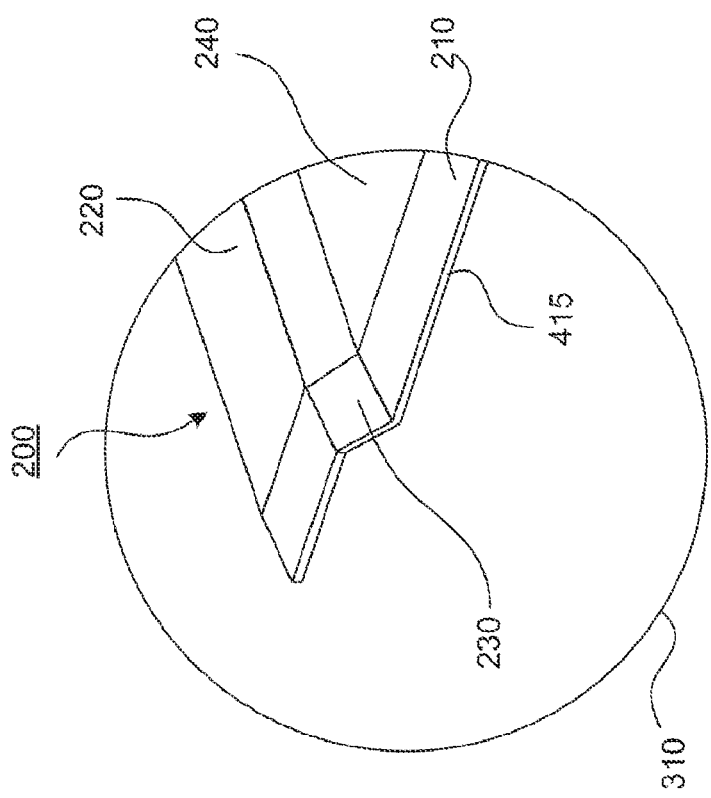

FIG. 2 depicts two views of a first blade 200 consistent with the current disclosure. The lower portion of FIG. 2 depicts an "edge" view of the first blade 200, and the upper portion of FIG. 2 depicts a "top" view of the first blade 200. FIGS. 3-5 depict further perspective and magnified views of first blade 200.

As depicted in FIGS. 2-5, the first blade 200 can include first region 240, where the first region 240 can be substantially flat. The first region 240 can be bounded on one side by edge 260, perimeter region 210 and bend 230. Perimeter region 210 can take the form of a beveled edge 415 (as shown in further detail, for example, in FIGS. 4 and 5). Perimeter region 250 (shown opposite perimeter region 210) can be similarly beveled. Consistent with the current disclosure, the width of the perimeter region 210 and the perimeter region 250 (along the x-direction) can be less than approximately 500 mm bounded by the overall dimensions of first blade 200 in the x-direction. For example, the width of each of the perimeter region 210 and the perimeter region 250 (along the x-direction) can be any value between approximately 500 mm and approximately 0.012 mm (and preferably approximately 0.508 mm), or any value less than approximately 0.012 mm. The bend 230 can be formed approximately 0.012 mm to approximately 500 mm from edge 265 (and preferably approximately 1 mm from edge 265), so that the width of region 230 is approximately 0.012 mm to approximately 500 mm (and preferably approximately 1 mm). Moreover, the bend 230 can have an elevation in the "z" direction such that depicted region 220 is "raised" relative to first region 240 by an amount less than approximately 0.5 mm, such as any value between approximately 0.5 mm and approximately 0.010 mm (and preferably approximately 0.254 mm), or any value less than approximately 0.01 mm. Alternatively, the value by which region 220 is "raised" relative to first region 240 can be less than approximately any one of the values: 0.45 mm, 0.4 mm, 0.39 mm, 0.38 mm, 0.37 mm, 0.36 mm, 0.35 mm, 0.34 mm, 0.33 mm, 0.32 mm, 0.31 mm, 0.3 mm, 0.29 mm, 0.28 mm, 0.27 mm, 0.26 mm, 0.25 mm, 0.24 mm, 0.23 mm, 0.22 mm, 0.21 mm, 0.2 mm, 0.19 mm, 0.18 mm, 0.17 mm, 0.16 mm, 0.15 mm, 0.14 mm, 0.13 mm, 0.12 mm, 0.11 mm, 0.1 mm, 0.09 mm, 0.08 mm, 0.07 mm, 0.06 mm, 0.05 mm, 0.04 mm, 0.03 mm, 0.02 mm, and 0.01 mm.

Figure 8:
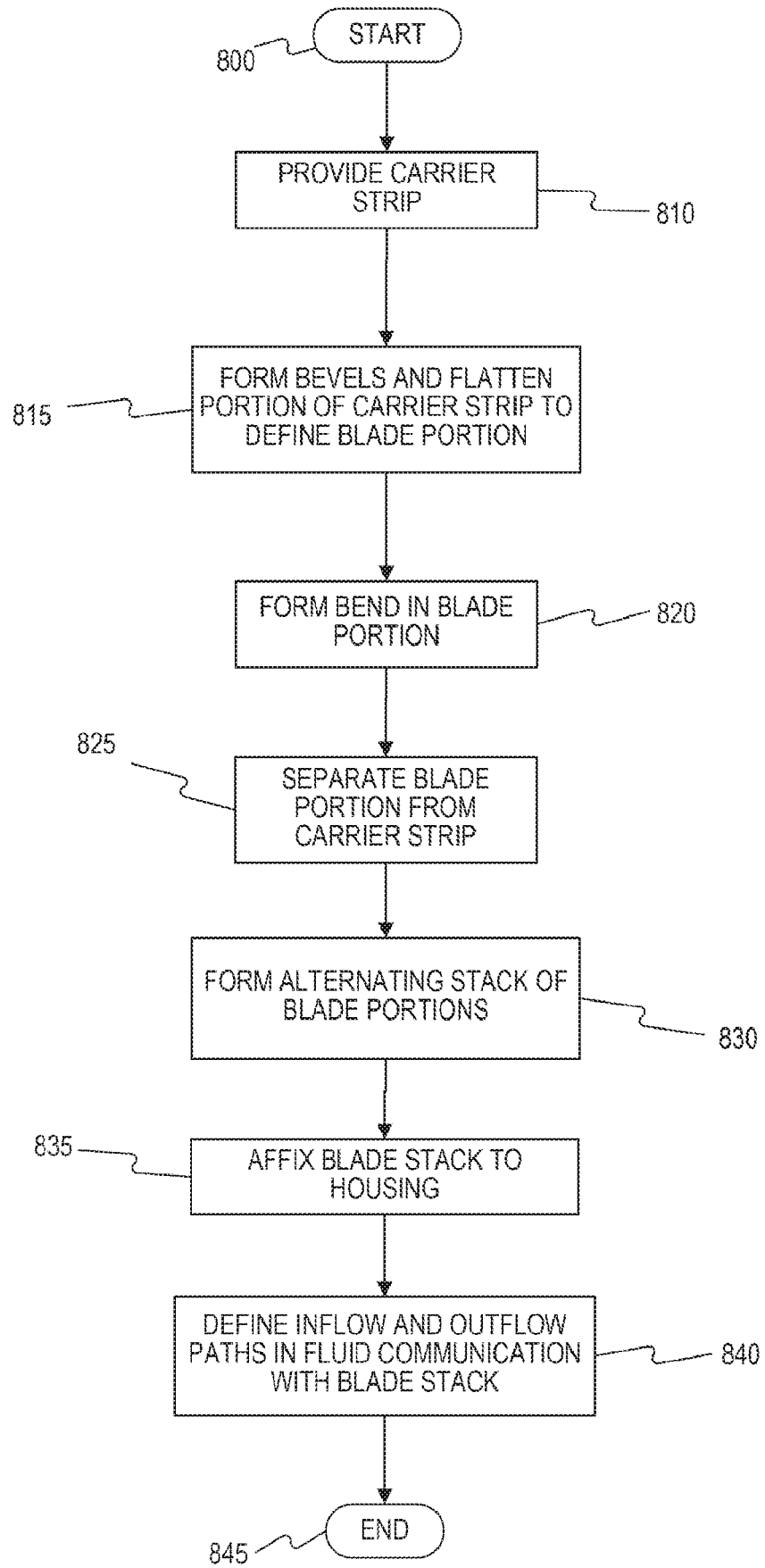
FIG. 8 depicts an exemplary method for forming a stack of blades consistent with the current disclosure.

Consistent with the current disclosure, the first blade 200 can be formed from any source of thermally conductive sheet material. For example, first blade 200 can be formed from a carrier strip of sheet metal fed from a roll into a progressive die in a high-speed press. (See step 810 of FIG. 8) On each cycle of the high-speed press, the die system can move the sheet metal forward to the next station in the progressive die. Moreover, the progressive die can have multiple lanes, each with the following sequence of stations: (a) a first station of the progressive die can be configured to cut three edges of sheet 100, leaving one edge connected to the carrier strip used to move the sheet 100 forward; (b) a second station of the progressive die can be configured to press the bevels into the perimeter regions 210 and 250, and also to flatten sheet 100 (to form substantially flat region 240, see step 815 of FIG. 8; (c) a third station of the progressive die configured to press the desired bend 230 into the first blade 200 (see step 820 of FIG. 8); and (d) a fourth station of the progressive die configured to cut the first blade 200 away from the carrier strip (see step 825 of FIG. 8).

Figure 6:
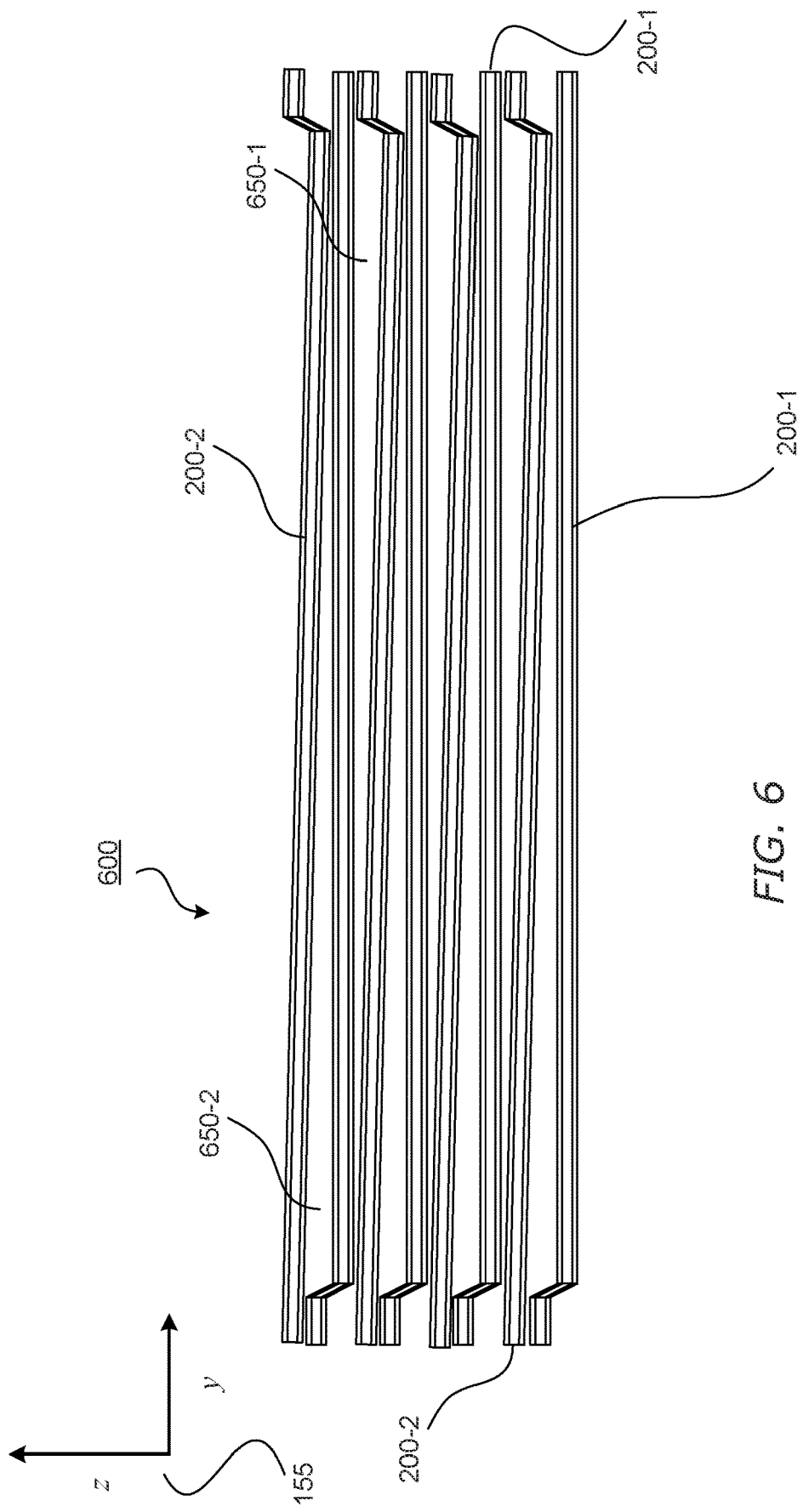
FIG. 6 depicts one view of a stack of eight alternating first and second blades for forming a series of channels consistent with the current disclosure.

Consistent with this disclosure, blades 200 being fed from the multiple lanes can be moved by robotic or simple mechanical methods into a stack 600, where the bends 230 of the stacked blades 200 can be arranged in a desired pattern of alternating orientation. FIG. 6 depicts a stack 600 of first and second blades (200-1 and 200-2) consistent with the current disclosure. The stack of first and second blades (200-1 and 200-2) forms a series of channels 650. As depicted in FIG. 6, each successive channel 650 (i.e., 650-1 and 650-2) can define triangular-shaped channels, where the "base" of the triangular-shaped channels alternates from side to side.

Figure 7:
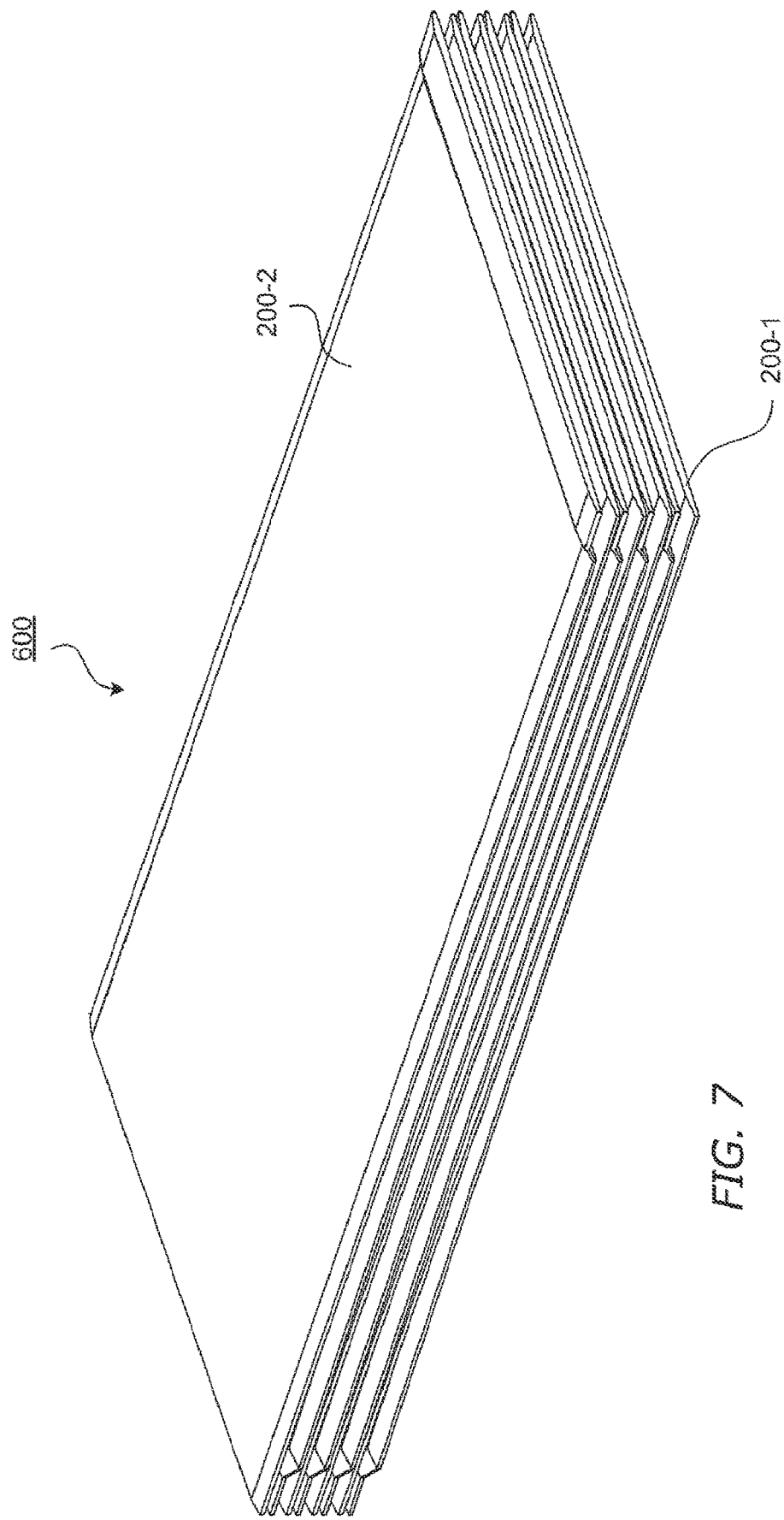
FIG. 7 depicts a perspective view of the stack of FIG. 6.

After formation, the stack 600 can be wrapped or boxed to maintain the desired order. FIG. 7 depicts a perspective view of the stack 600 of FIG. 6. In an embodiment, and as depicted in FIGS. 6 and 7, the stack 600 of alternating first blades (200-1) and second blades (200-2) can be configured such that, for each first blade 200-1 and an adjacent second blade 200-2: the perimeter portion 210 of each first blade 200-1 is aligned with the perimeter portion 250 of the adjacent second blade 200-2; the edge 265 each first blade 200-2 is aligned with the edge 260 of the adjacent second blade 200-2; and the edge 265 of each first blade 200-1 is aligned with the edge 260 of the adjacent second blade 200-2.

Figure 9:
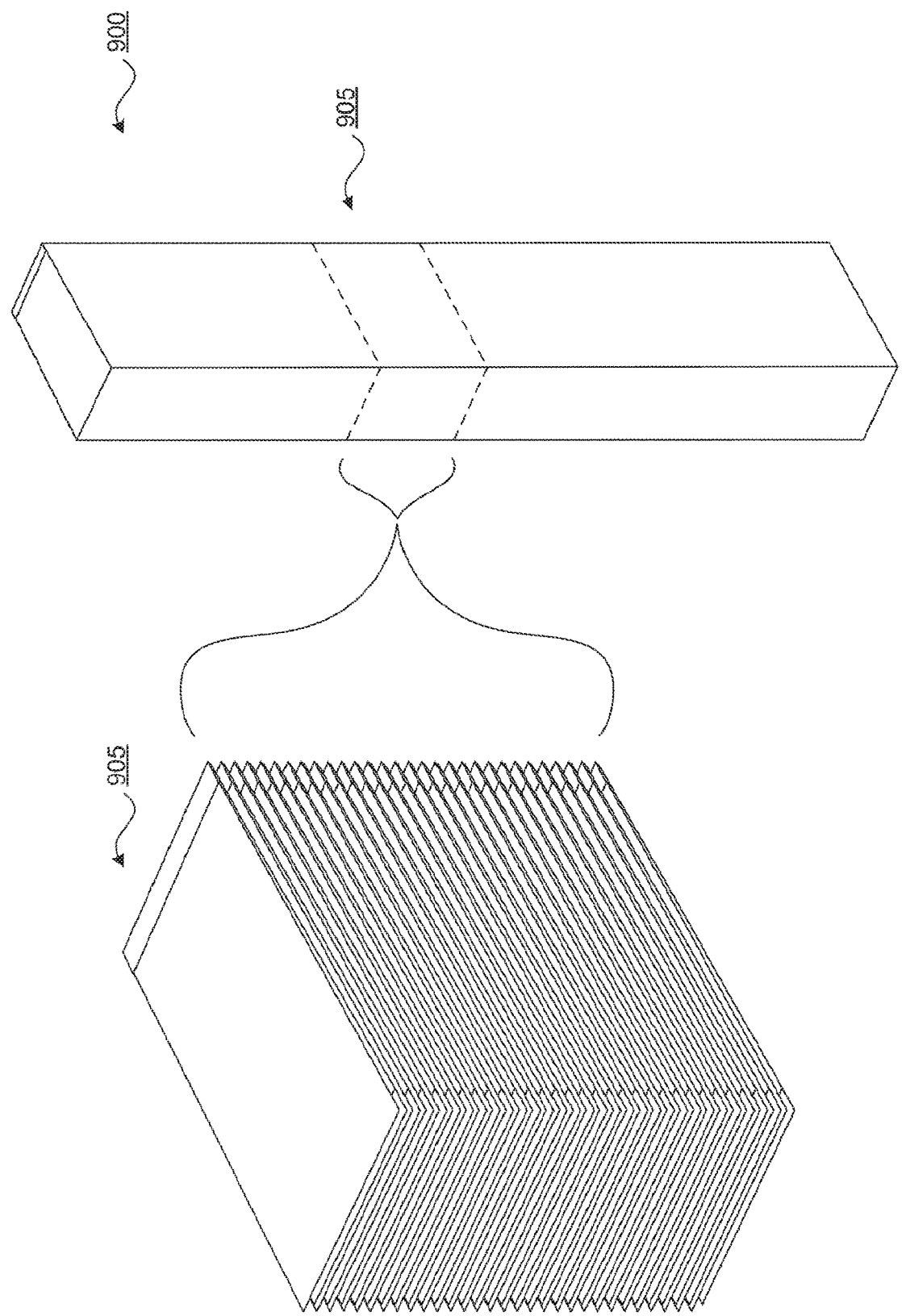
FIG. 9 depicts a stack of several hundred alternating first and second blades for forming several hundred channels consistent with the current disclosure.

As depicted in FIGS. 6 and 7, such a structured stack of blades forms a series of channels that can accommodate a flow of gas. Moreover, as depicted in FIG. 9, an embodiment consistent with the current disclosure can have several hundred blades in a single stack and preferably, approximately 500 blades. Alternatively, an embodiment consistent with the current disclosure can have a few blades to several tens of blades in a single stack. For example, a stack 900 of blades can be configured to be approximately 6 inches tall (i.e., approximately 150 mm). However, the overall height of the blade stack 900, consistent with the current disclosure, can be determined by the dimensions of the structure (such as a wall or other boundary) intended to be cooled.

Figure 10:
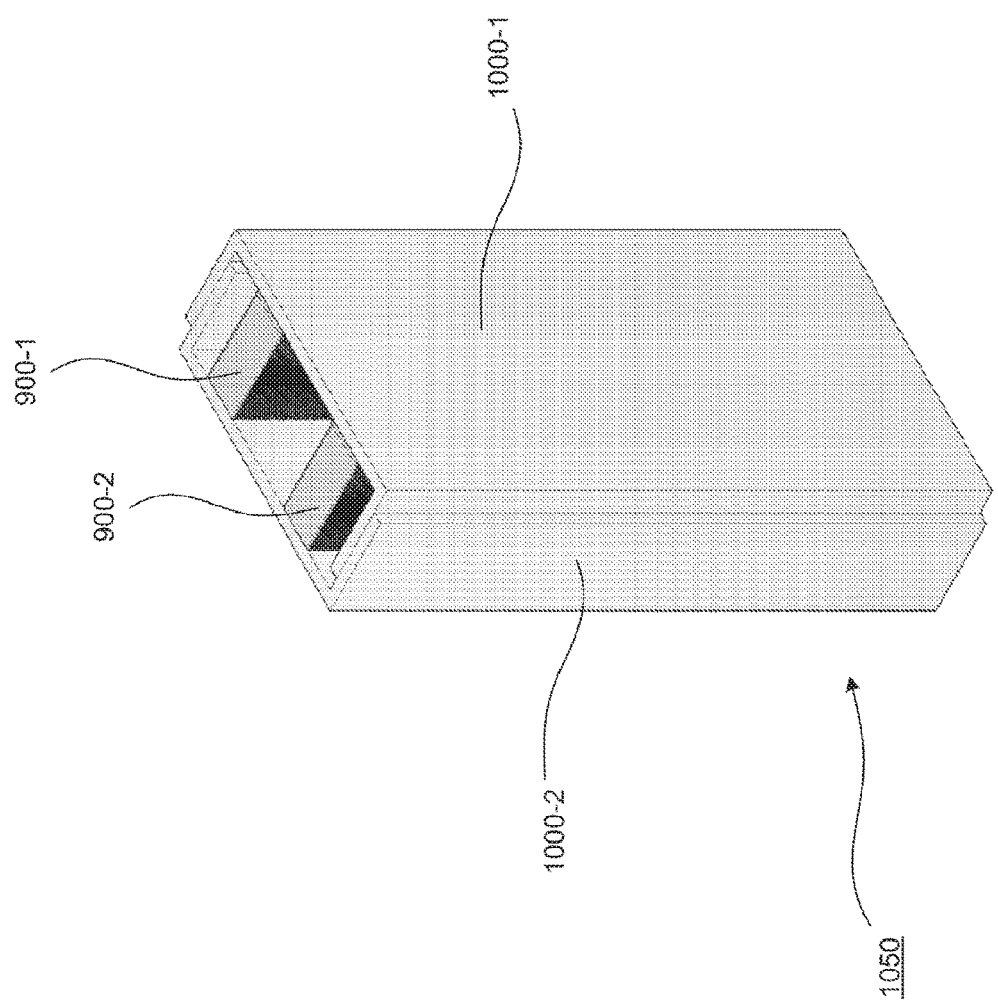
FIG. 10 depicts two stacks of alternating first and second blades and a portion of housing for an embodiment consistent with the current disclosure.
Figure 11:
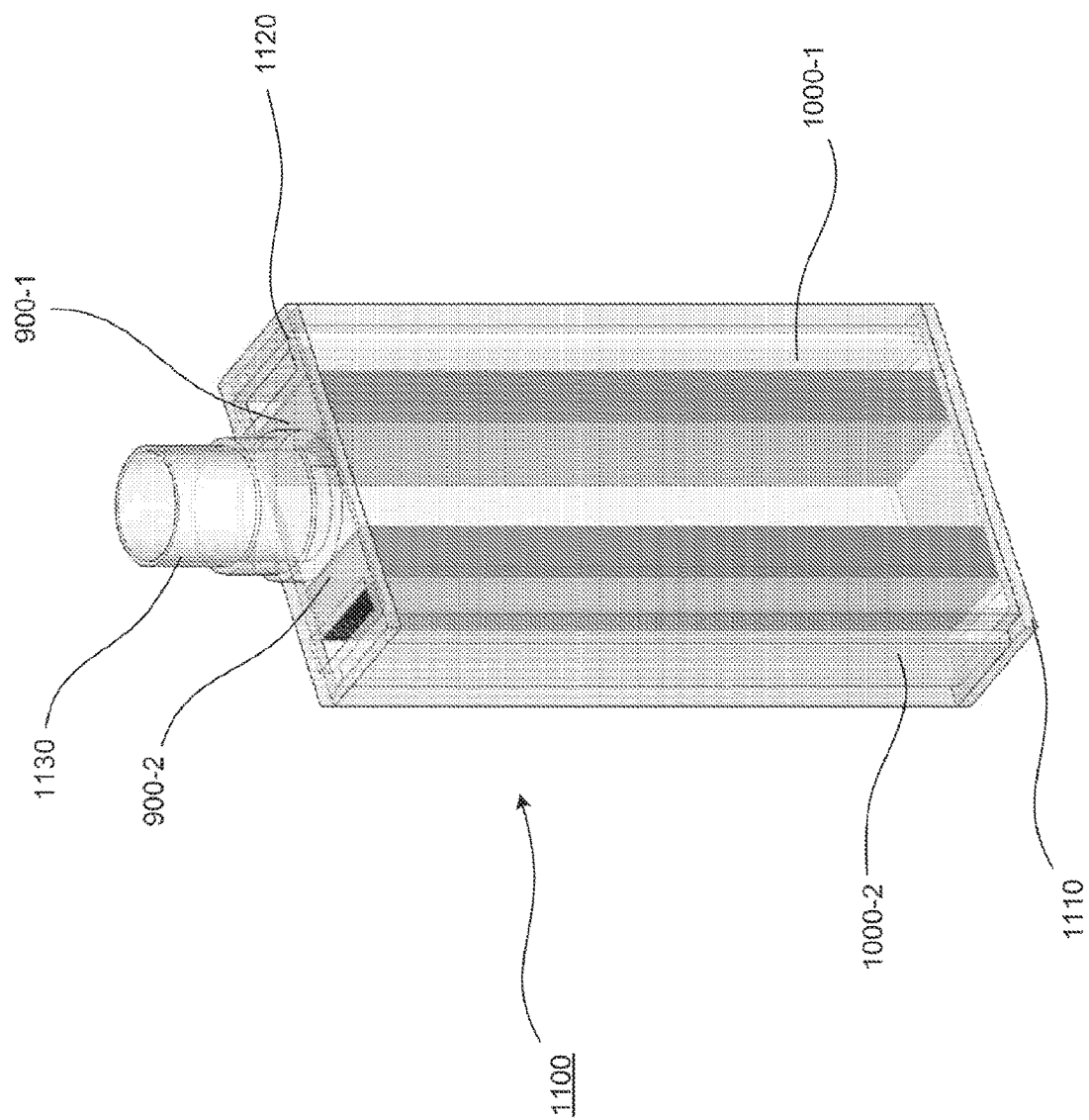
FIG. 11 and FIG. 13 depict two perspective views of an embodiment consistent with the disclosure, where the internal position of the stacks of alternating first and second blades are shown.

In one embodiment, an assembly consistent with the current disclosure can be configured with two stacks of blades as described above. FIGS. 10-14 depict views of a system consistent with such an embodiment. As depicted in FIG. 10, one stack 900-11 can be affixed or otherwise attached to one U-shaped enclosure 1000-1, and a second stack 900-2 can be affixed or otherwise attached to a second U-shaped enclosure 1000-2. The method of affixing a blade stack to an enclosure can be by any means known in the art, such as (without limitation) by welding and/or by using heat-cured thermally-conductive epoxy. The two combinations (i.e., stack 900-1 and enclosure 1000-1, and stack 900-2 and enclosure 1000-2) can then be affixed together as depicted in FIG. 10 to form enclosure 1050. Each U-shaped enclosure (1000-1 and 1000-2) can be cut from U-channel extruded metal.

Additional portions of an assembly consistent with the current disclosure, as depicted in FIGS. 11-14, include ends 1110 and 1120, and tube 1130. The ends 1110 and 1120 can be cut from metal sheets, and the tube 1130 can be cut from tube stock. Support collar 1135 (as depicted, for example, in FIG. 12) can be formed of molded metal. Heat-cured thermally-conductive epoxy can be used throughout the assembly. (Alternatively, or in addition, any other means of affixing the components together can also be used, such as, without limitation, welding). For example, a rectangular area of epoxy can be applied to the inside base of one of the cut pieces of the U-shaped enclosure 1000-1 (or 1002-2), where one stack 900-1 of blades will be installed (or stack 900-2). The stack 900 of blades (900-1 or 900-2) can be aligned in contact with the epoxy on the U-shaped enclosure 1000 (1000-1 or 1000-2), and can be clamped in position. The assembly consisting of a stack 900 of blades and a U-shaped enclosure 1000 can then be baked in an oven to cure the epoxy.

As discussed, two U-shaped enclosures 1000-1 and 1000-2 with installed blade stacks 900-1 and 900-2 can then be epoxied together as follows. Epoxy can be applied to the areas where the blade stacks 900-1 or 900-2 meet the U-shaped enclosures 1000-2 or 1000-1. Epoxy can also be applied to the two side surfaces where the U-shaped enclosures (1000-1 and 1000-2) make contact with one another. These joined U-shaped enclosures can then be baked in an oven to cure the epoxy. Alternatively, or in addition, welding can be used to affix the components together.

Further, consistent with the current disclosure, the enclosure end 1110, the tube 1130, and the support collar 1135 can be assembled with epoxy at every interface and baked to cure the epoxy, and/or the components can be welded together.

Finally, where epoxy is used, the enclosure end 1120 can be clamped to the assembled U-shaped enclosure pair 1050 with epoxy in every interface and the unit can be baked to cure the epoxy.

Figure 12:
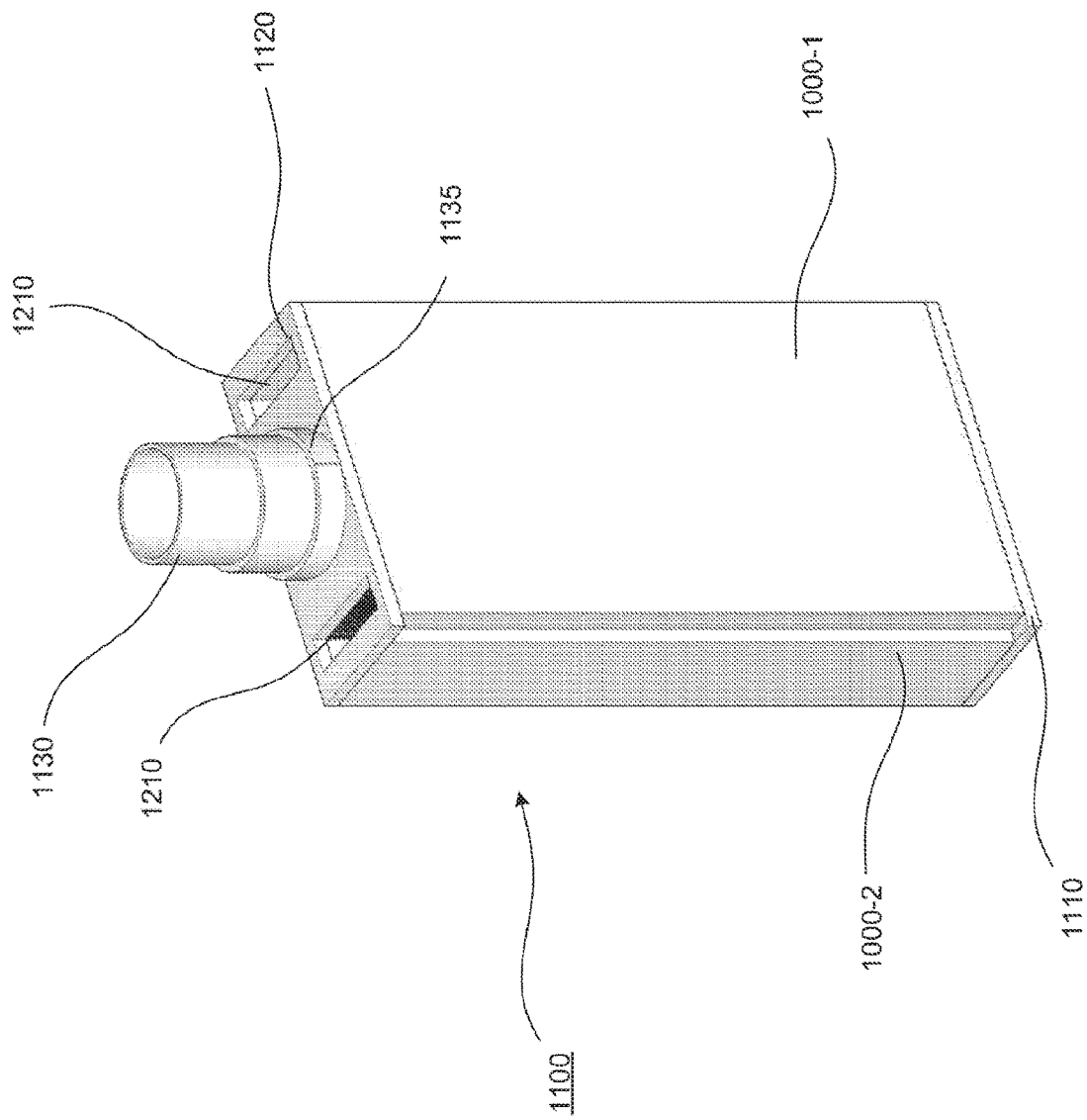
FIG. 12 and FIG. 14 depict two perspective views of the embodiment of FIGS. 11 and 13, and where breather openings are depicted.
Figure 13:
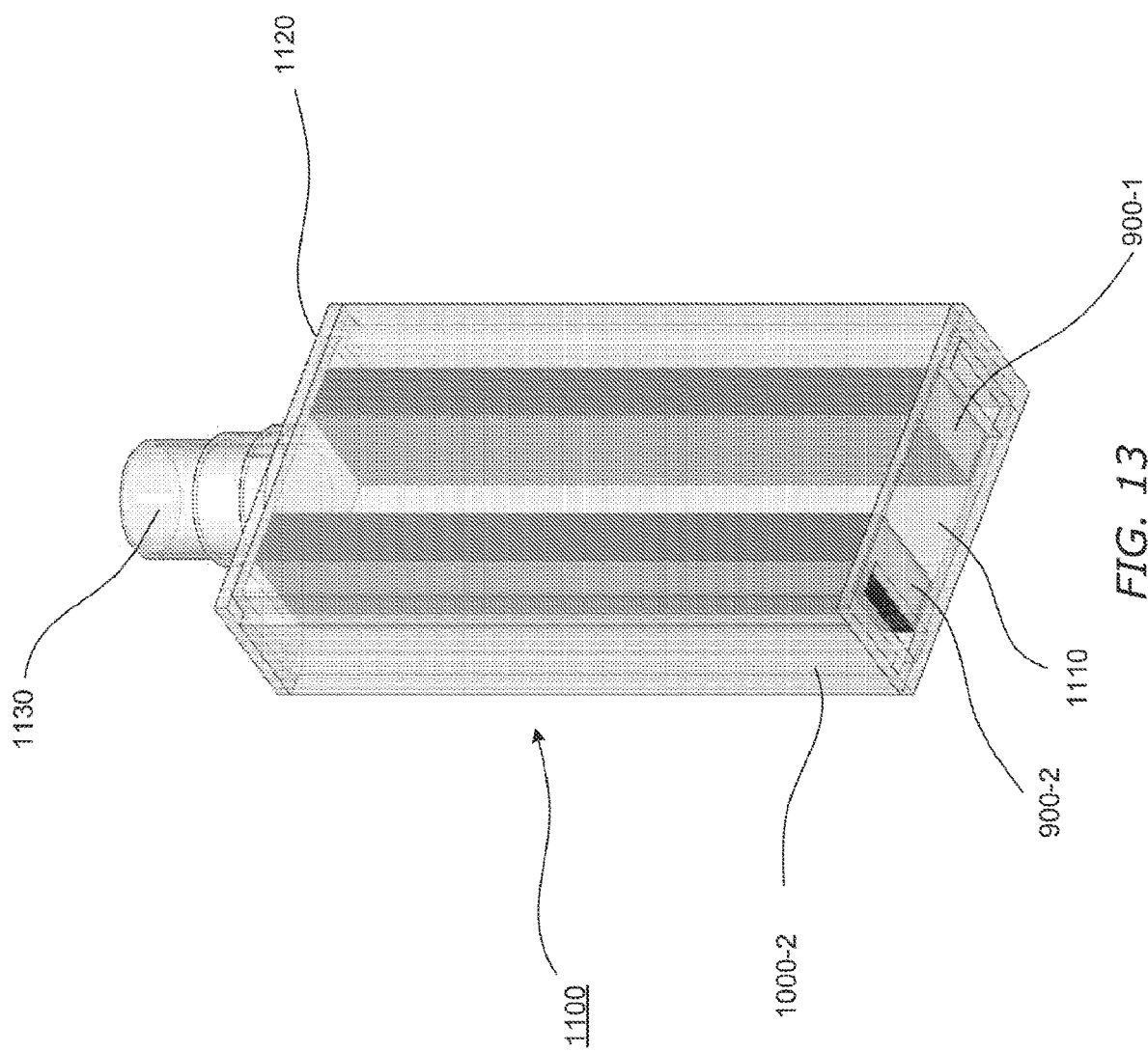
Figure 14:
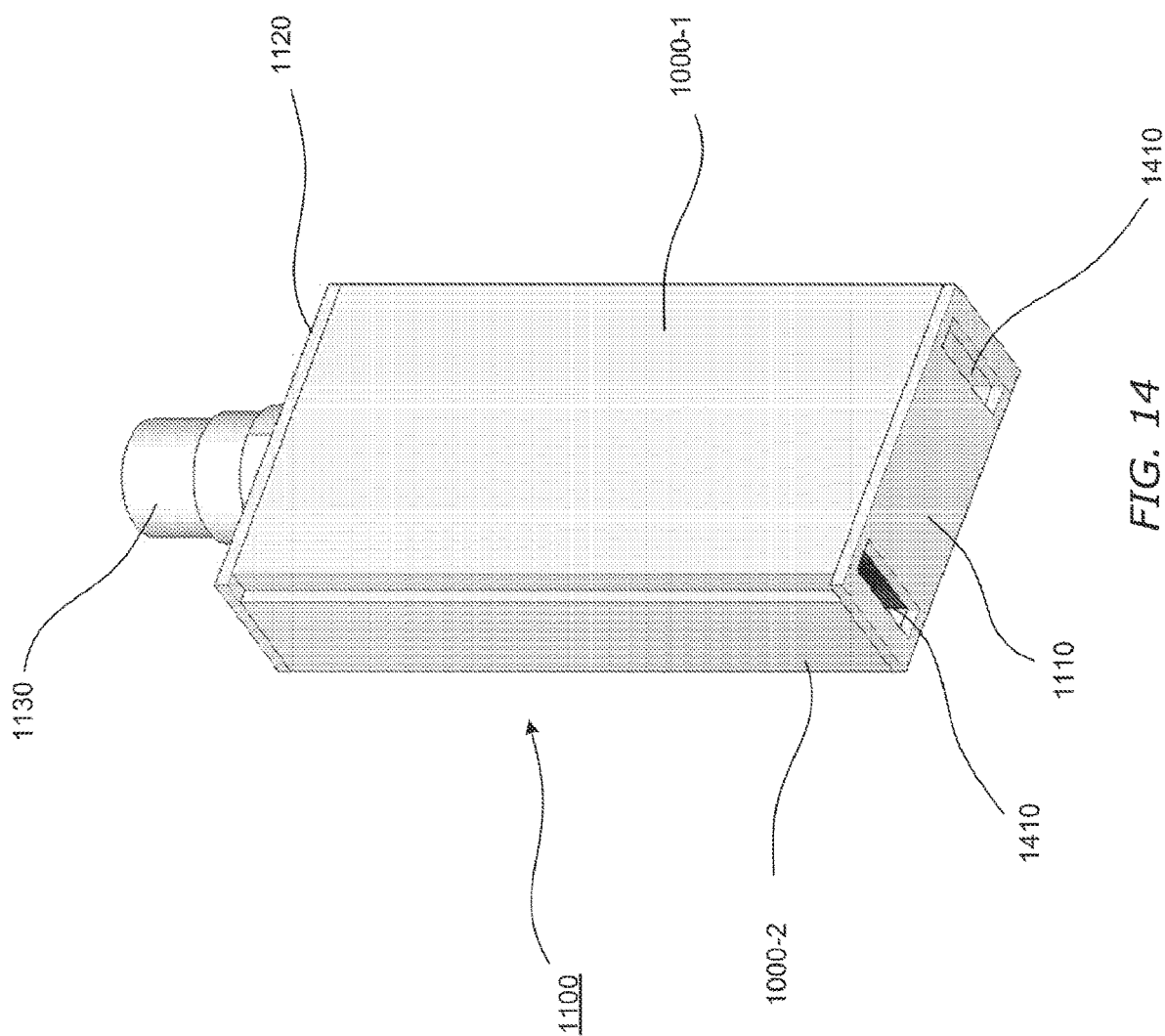

As depicted in FIGS. 12 and 14, breather openings 1210 and 1410 can be included in the enclosure ends 1120 and 1110. Consistent with the disclosure, the breather openings 1210 and 1410, the stacks 900-1 and 900-2, and the tube 1130 define a path for a flow of gas. For example, a slight decrease of pressure can be introduced at the opening of tube 1130, which will induce the flow if gas into the breather openings 1210 and 1410 and through the channels defined in each of the stacks 900-1 and 900-2.

Figure 15:
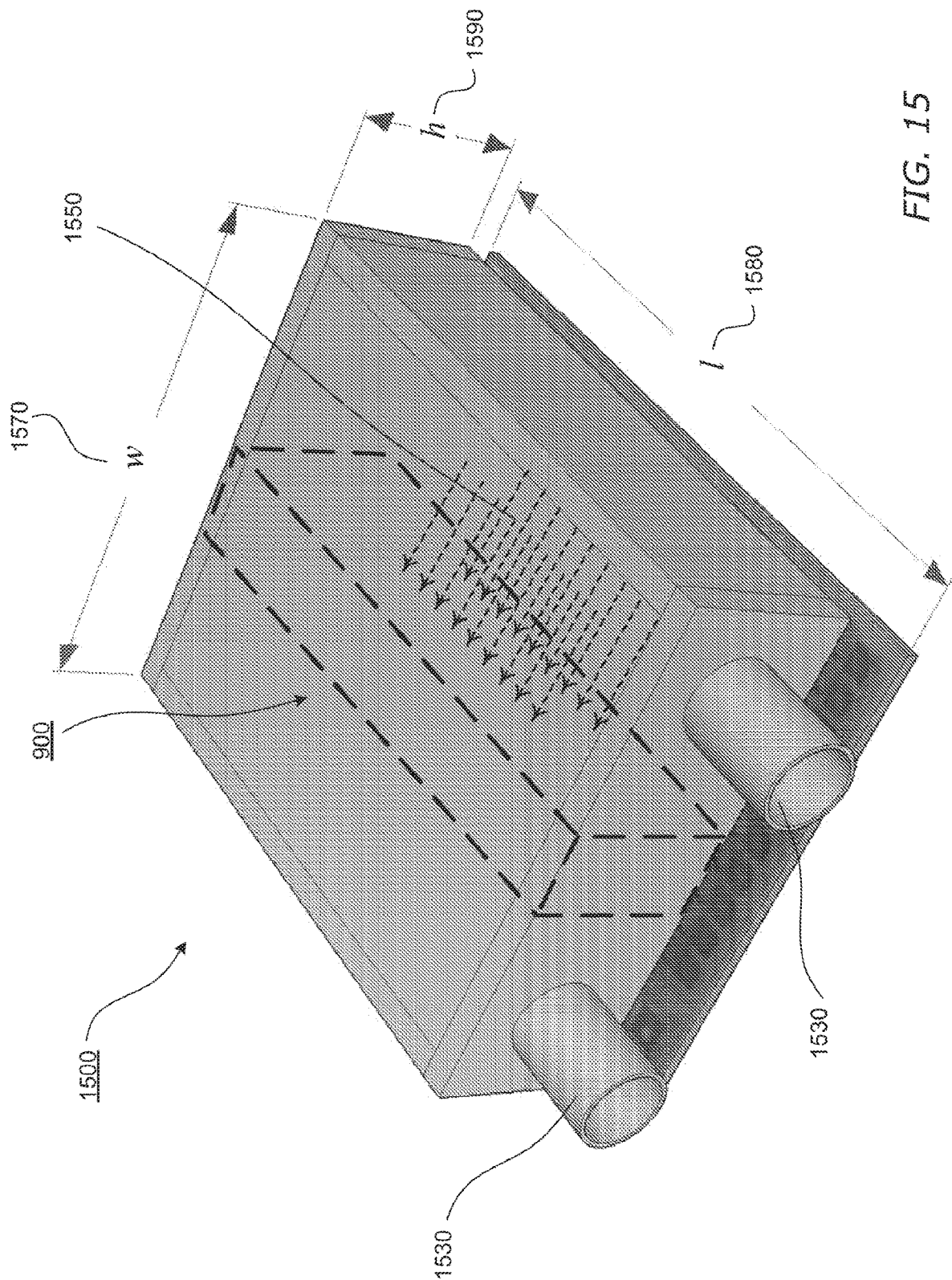
FIGS. 15 and 16 depict a further embodiment consistent with the current disclosure.
Figure 16:
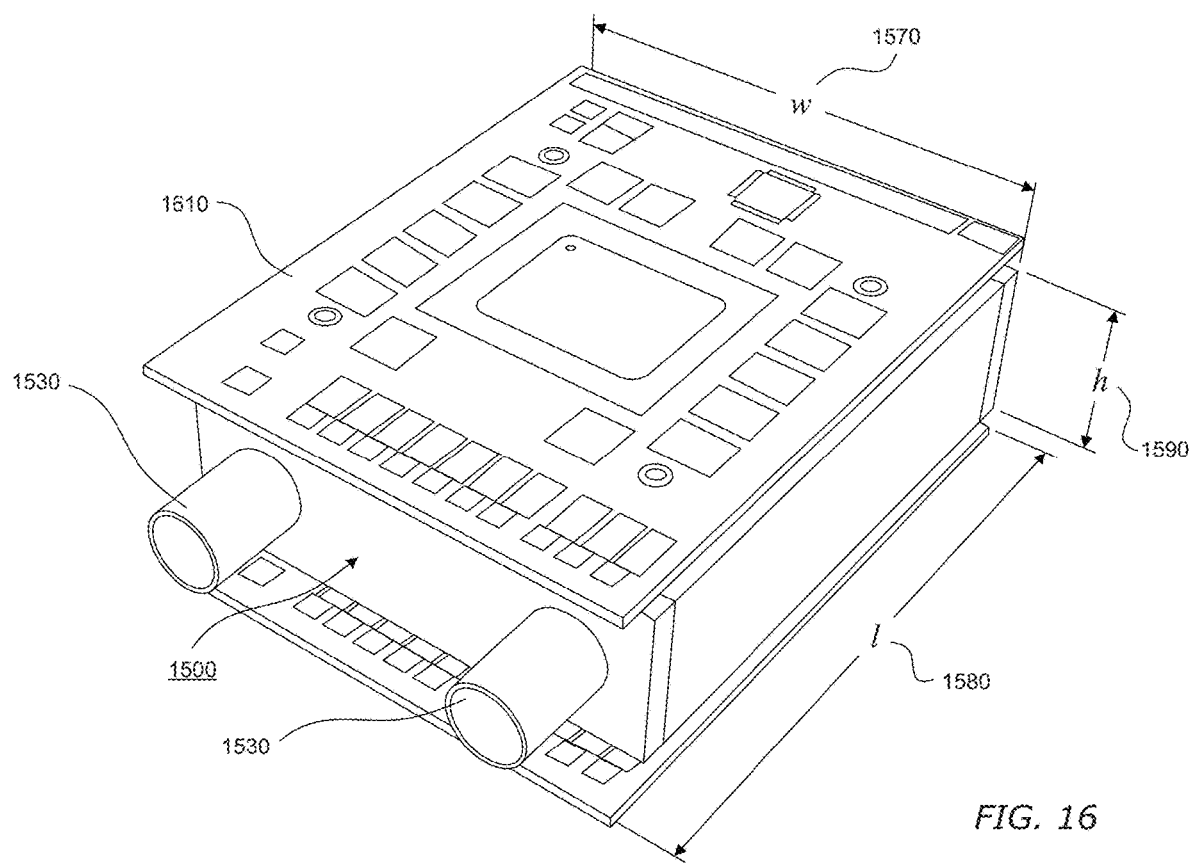

In accordance with another embodiment consistent with this disclosure, FIGS. 15 and 16 depict an assembly 1500 with tubes 1530. One of the tubes 1530 can serve as an "input" for a flow of gas, and the other of the tubes 1530 as an "output." Between the two tubes (and depicted by dashed line in FIG. 15) is stack 900 of blades, aligned to permit the flow of gas between the two tubes 1530. An exemplary flow of gas, consistent with this embodiment, is depicted with arrows 1550.

Consistent with this disclosure, the width 1570 can be approximately 4.5 inches (approximately 114.3 mm), the height 1590 can be approximately 1.5 inches (approximately 38.1 mm), and the length 1580 can be approximately 5.9 inches (approximately 150 mm). Accordingly, and as depicted in FIGS. 15 and 16 (with circuit board 1610), assembly 1500 can be configured to be physically compliant with a conventional PCIe slot.

While the above example was provided in the context of cooling a computer system, one of ordinary skill in the art should appreciate that the number of blades (and the dimension of the blades) in a stack of blades can vary depending upon the cooling application. For example, and without limitation, a stack of blades for a cooling application configured to remove approximately 0.1 W from a cell phone (or other similar device) can consist of a few blades or a few tens of blades. In a cell phone application, the blades can preferably be formed, for example, from 3 mm squares of metal. Conversely, stacks of blades for larger cooling applications—such as for cooling a nuclear reactor or cooling a locomotive engine—can consist of millions of blades. For such applications, where large quantities of heat are to be extracted, the blades can preferably have dimensions, for example, of 12 mm by 25 mm.

In accordance with another aspect of this disclosure, a method of configuring a series of channels is depicted in FIGS. 17-23. A resulting embodiment, which can include a folded sheet 2300 configured to present a series of channels, is depicted in FIG. 24.

Figure 17:
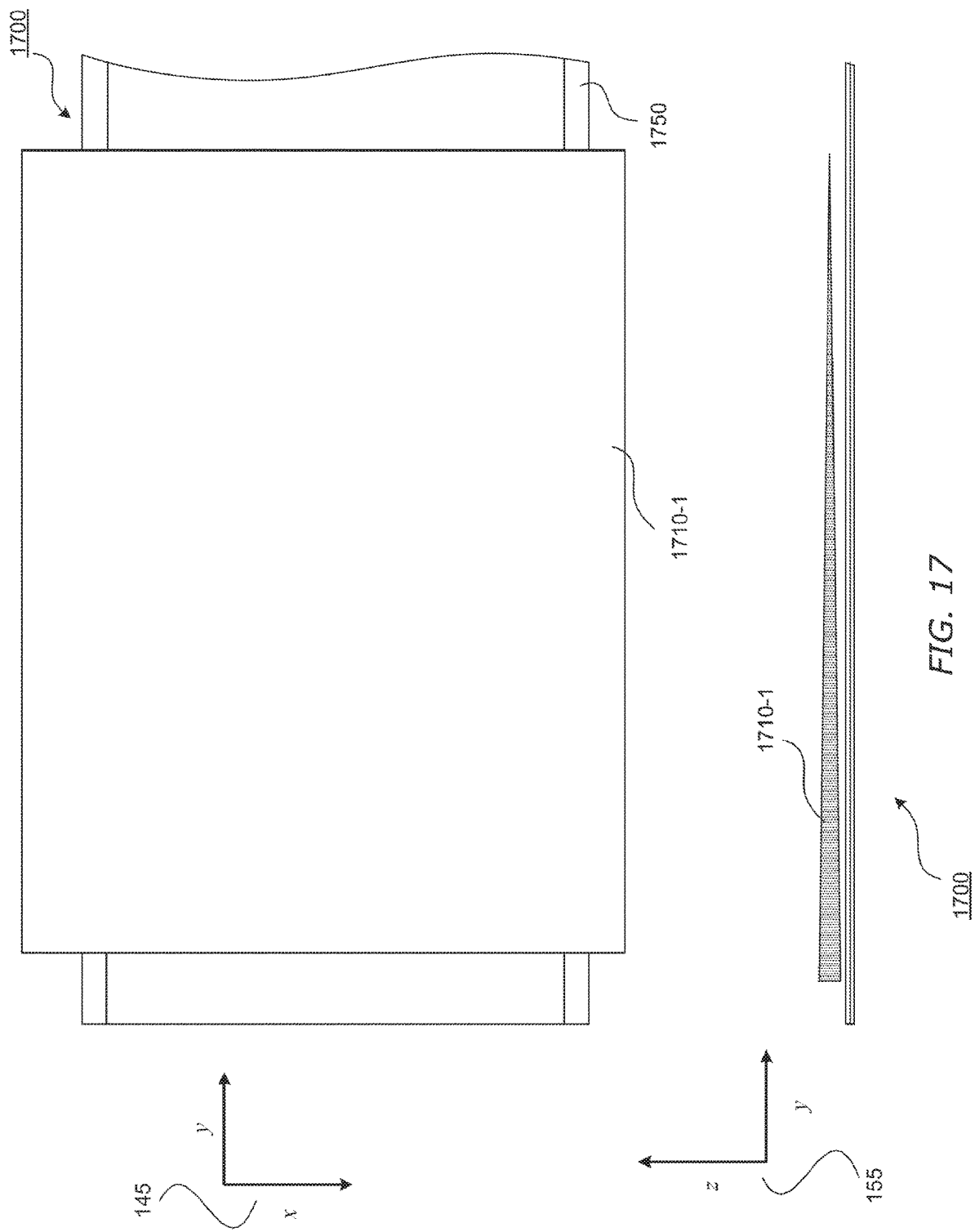
FIG. 17 depicts two views of a combination of an exemplary sheet for forming a folded sheet and an exemplary spacer.

Consistent with this disclosure, FIG. 17 depicts two views of sheet 1700 and spacer 1710-1. Spacer 1710-1 can be configured to exhibit a wedge-like shape. As illustrated in FIG. 17, the shape of an overlapping region of spacer 1710-1 and sheet 1700 can be substantially rectangular. However, the depicted shape is not limiting. The width of the overlapping region along the y-axis can be approximately 10 m or less, such as any value between approximately 10 m and approximately 1 mm (and preferably approximately 25.4 mm), or any value less than approximately 1 mm. The length of the overlapping region along the x-axis can be approximately 1 m or less, such as any value between approximately 1 m and approximately 0.5 mm (and preferably approximately 12.7 mm), or any value less than approximately 0.5 mm. The thickness of sheet 1700 can be approximately 25 mm or less, such as any value between approximately 25 mm and approximately 0.025 mm (and preferably approximately 0.1778 mm), or any value less than approximately 0.025 mm.

The lower portion of FIG. 17 depicts an "edge" view of the sheet 1700 and spacer 1710-1, and the upper portion of FIG. 17 depicts a "top" view of the sheet 1700 and the spacer 1710-1. Similar to aspects of the first blade 200 depicted in FIGS. 3-5 (in relation to perimeter regions 210 and 250), the sheet 1700 can include side regions 1750. Side regions 1750 can take the form of a beveled edge, where the width of wide regions 1750 (along the x-direction) can be less than approximately 500 mm bounded by the overall dimensions of the sheet 1700 in the x-direction. For example, the width of each of the side regions 1750 (along the x-direction) can be any value between approximately 500 mm and approximately 0.012 mm (and preferably approximately 0.508 mm), or any value less than approximately 0.012 mm. One of ordinary skill in the art would appreciate that the side regions 1750 can be made beveled by conventional means, such as (without limitation) by pressing the edges of the strip of metal between the cylindrical rollers of a rolling mill.

The spacer 1710-1 can be configured to exhibit a "height" in the z-direction that is less than approximately 0.5 mm, such as any value between approximately 0.5 mm and approximately 0.010 mm (and preferably approximately 0.254 mm), or any value less than approximately 0.01 mm. Alternatively, the "height" in the z-direction of spacer 1710-1 can be less than approximately any one of the values: 0.45 mm, 0.4 mm, 0.39 mm, 0.38 mm, 0.37 mm, 0.36 mm, 0.35 mm, 0.34 mm, 0.33 mm, 0.32 mm, 0.31 mm, 0.3 mm, 0.29 mm, 0.28 mm, 0.27 mm, 0.26 mm, 0.25 mm, 0.2.4 mm, 0.23 mm, 0.22 mm, 0.21 mm, 0.2 mm, 0.19 mm, 0.18 mm, 0.17 mm, 0.16 mm, 0.15 mm, 0.14 mm, 0.13 mm, 0.12 mm, 0.11 mm, 0.1 mm, 0.09 mm, 0.08 mm, 0.07 mm, 0.06 mm, 0.05 mm, 0.04 mm, 0.03 mm, 0.02 mm, and 0.01 mm.

Figure 18:
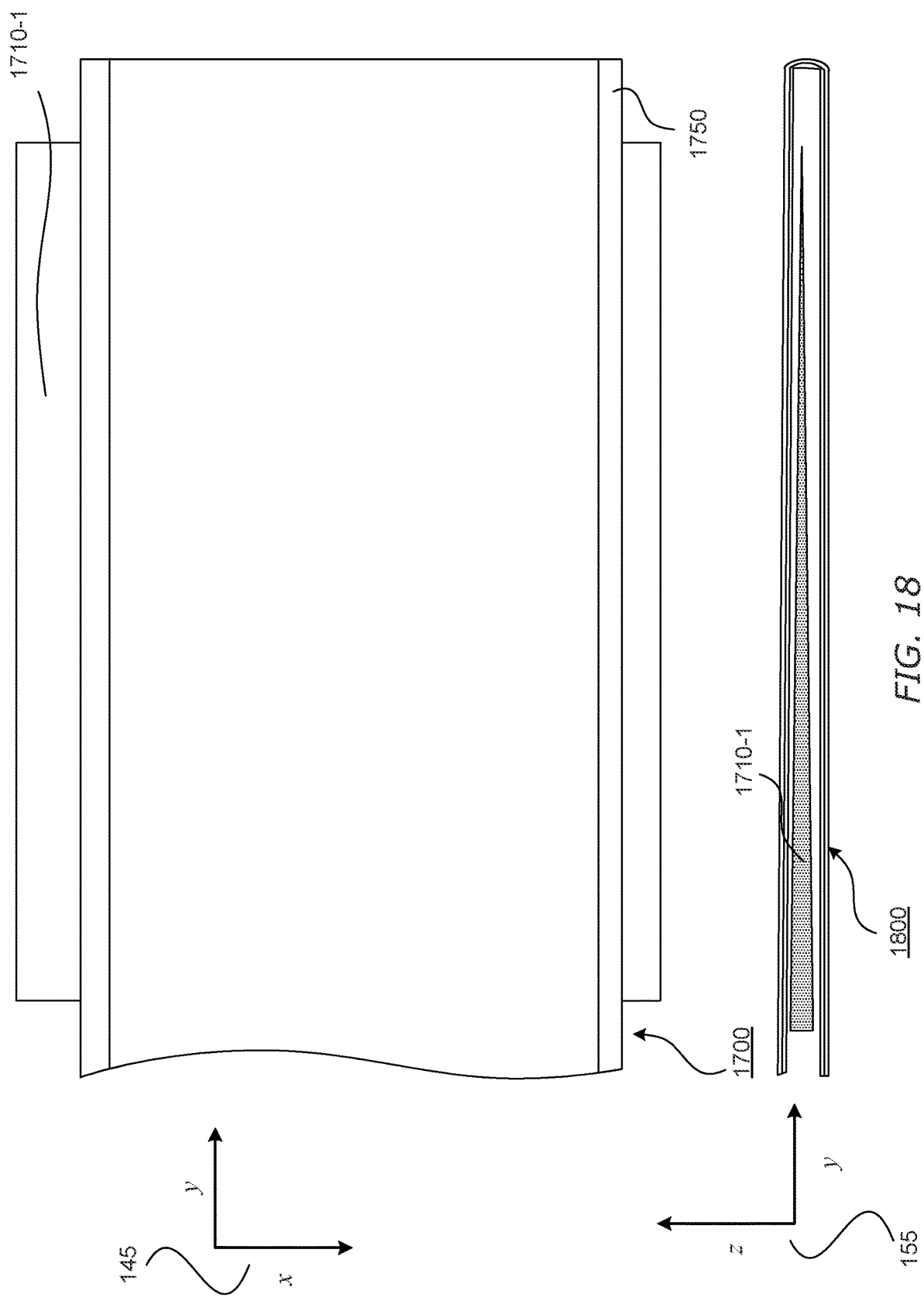
FIG. 18 depicts two views of the combination of FIG. 17, in which the exemplary sheet folded over the exemplary spacer.
Figure 19:
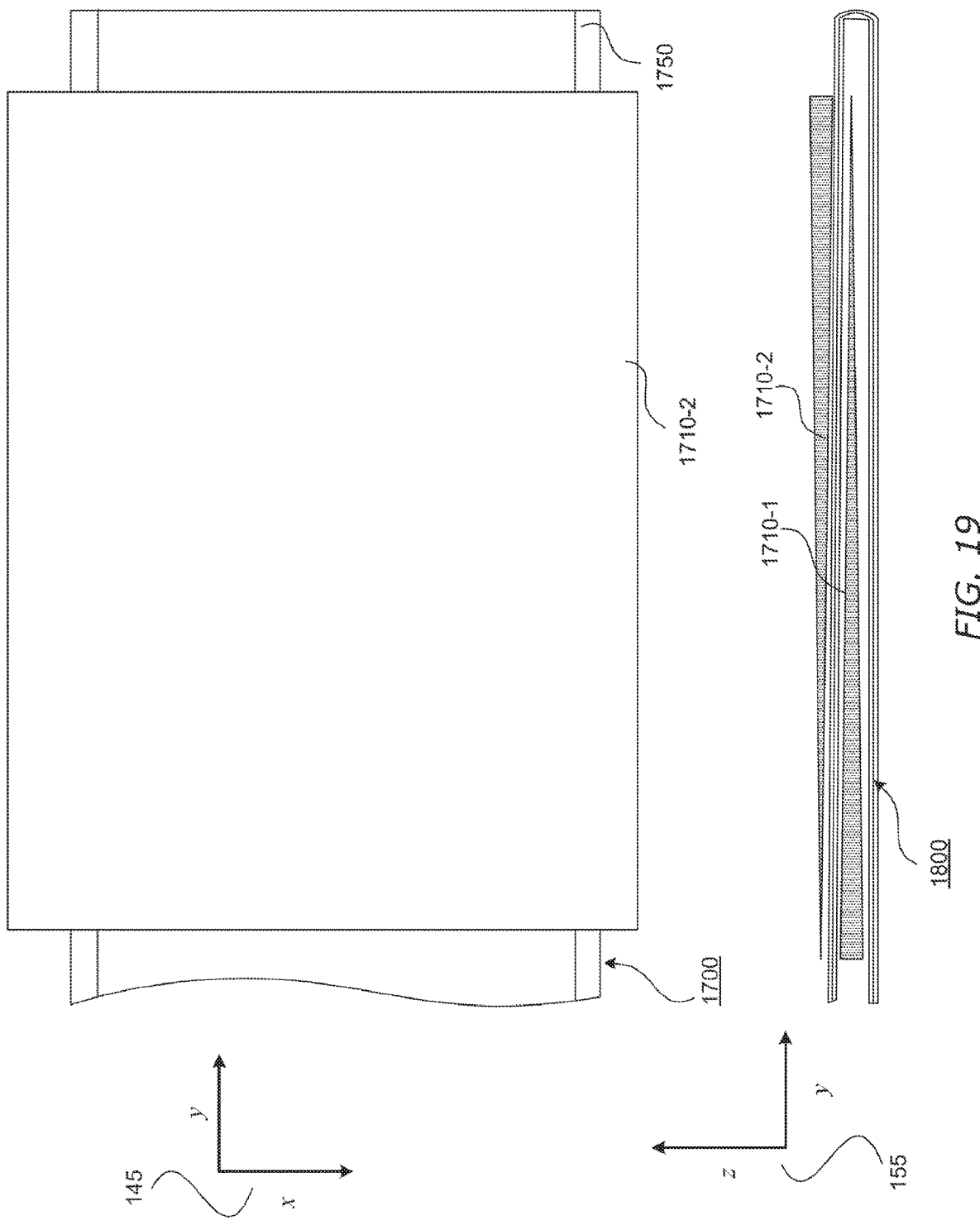
FIG. 19 depicts two views of the combination of FIG. 18, including an exemplary alternating spacer.
Figure 20:
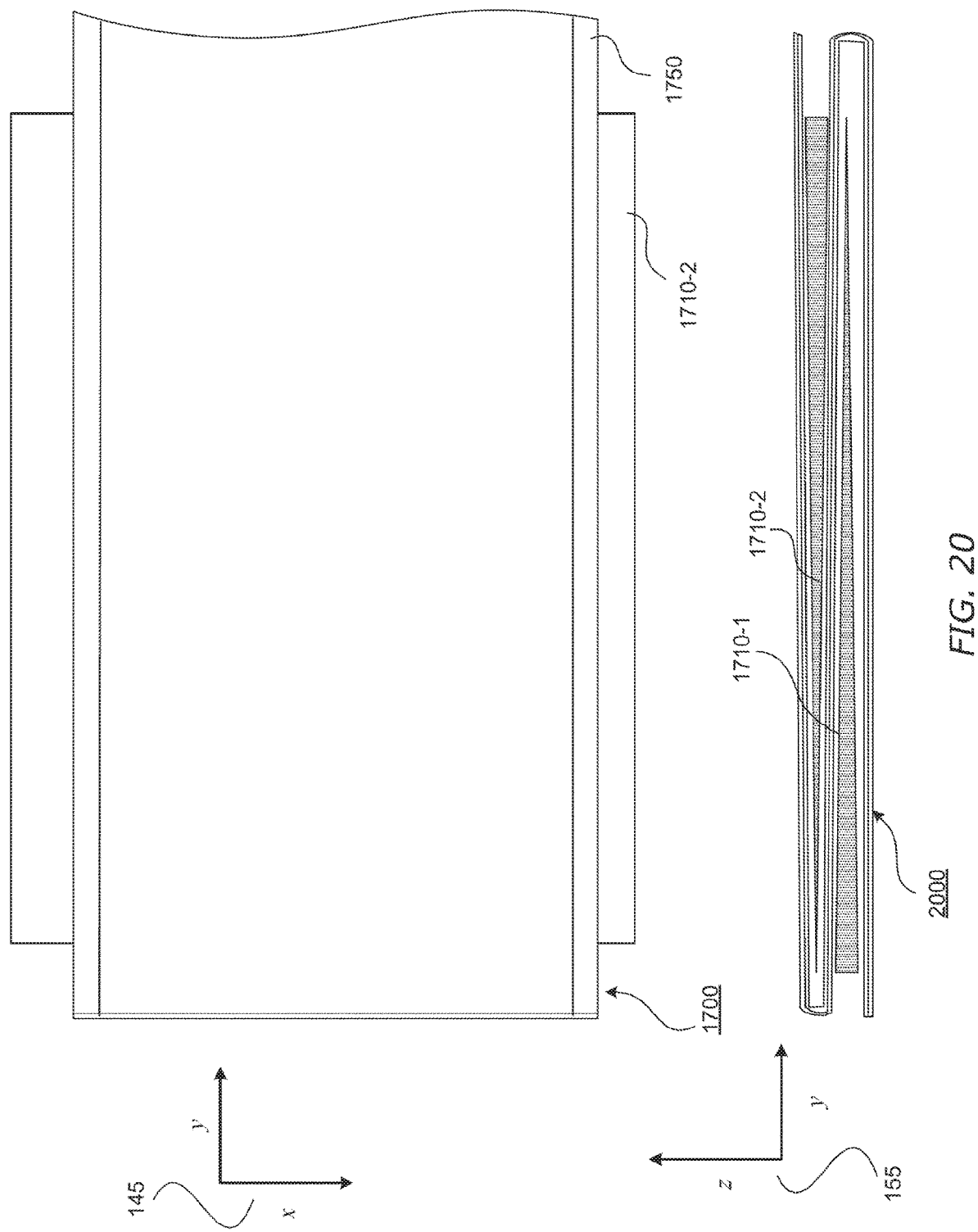
FIG. 20 depicts two views of the combination of FIG. 19, in which the exemplary sheet is folded over the exemplary alternating spacer.
Figure 21:
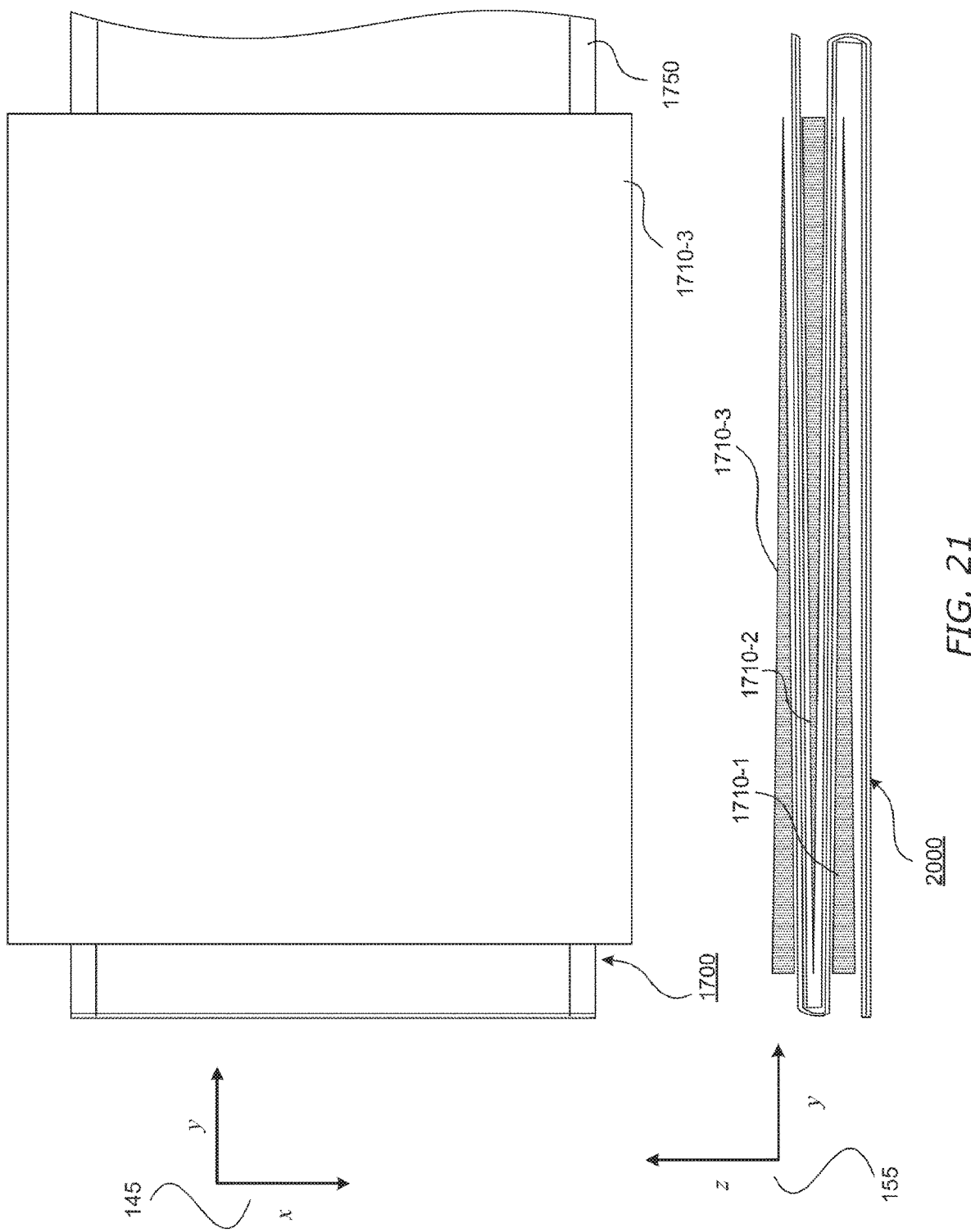
FIG. 21 depicts two views of the combination of FIG. 20, including a further exemplary alternating spacer.
Figure 22:
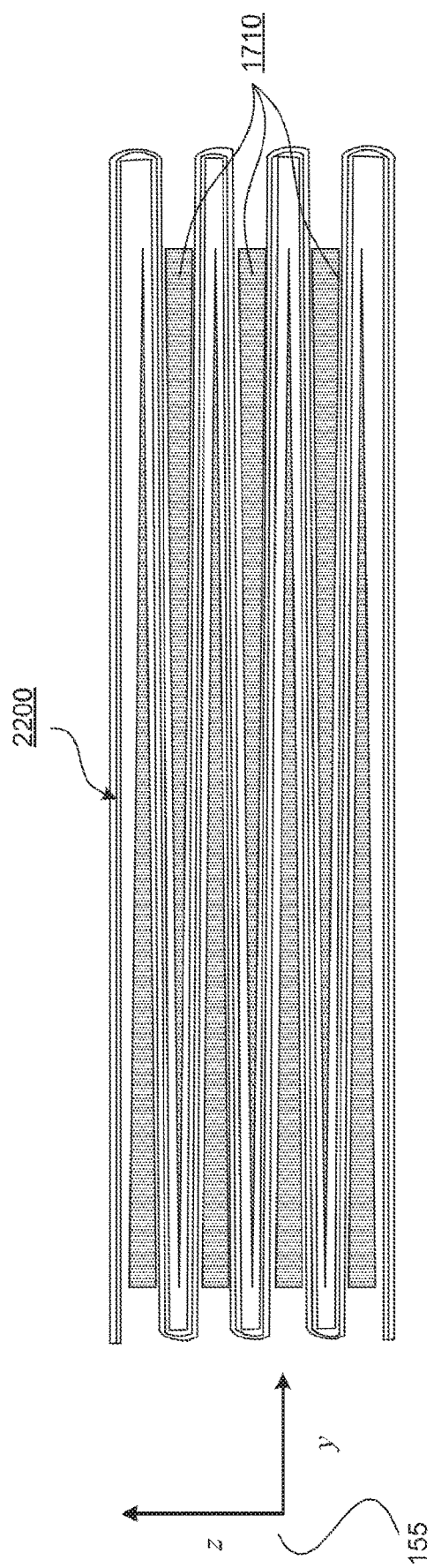
FIG. 22 depicts a side view of the combination of FIG. 21, including four additional exemplary alternating spacers and five additional folds of the exemplary sheet.
Figure 25:
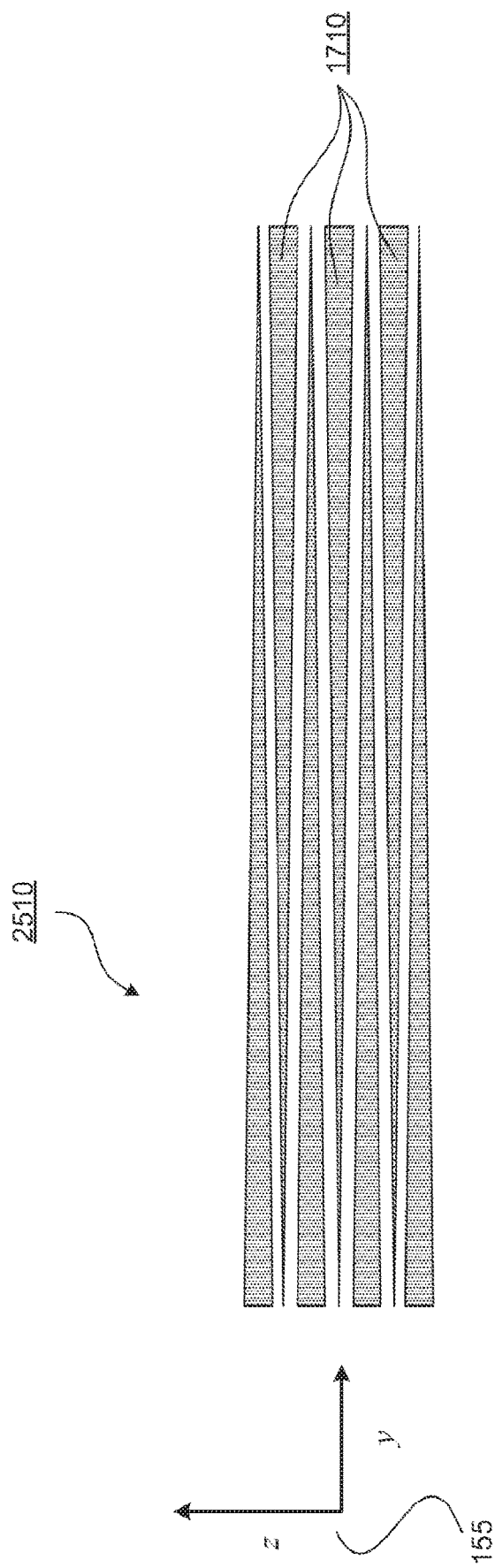
FIG. 25 depicts an exemplary configuration of spacers in an alternating sequence.
Figure 26:
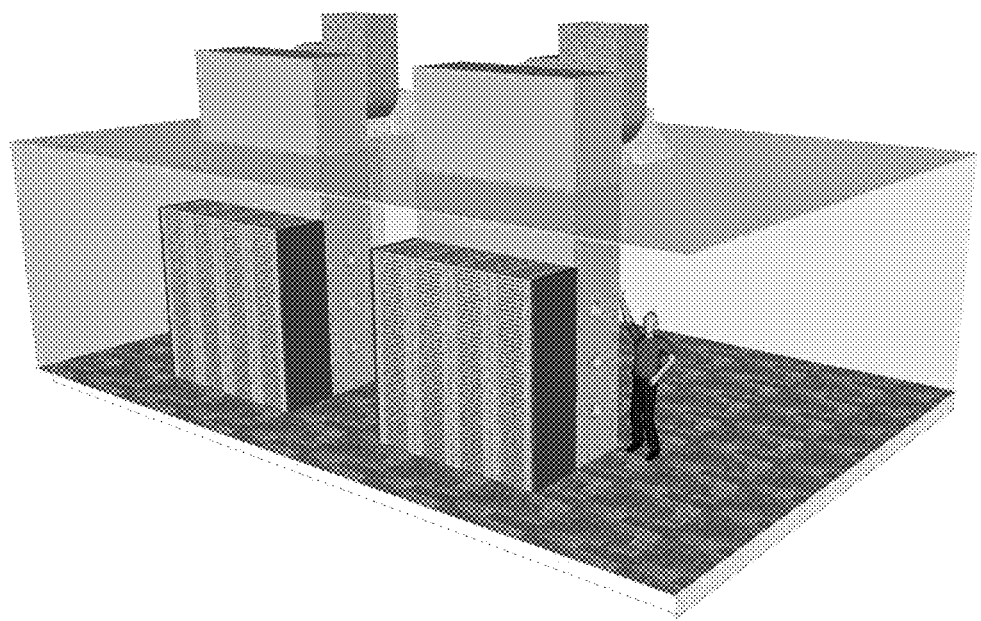
FIGS. 26-32 are associated with Appendix A, and depict an exemplary configuration of computer systems to be cooled and a cooling system consistent with the disclosure.
Figure 27:
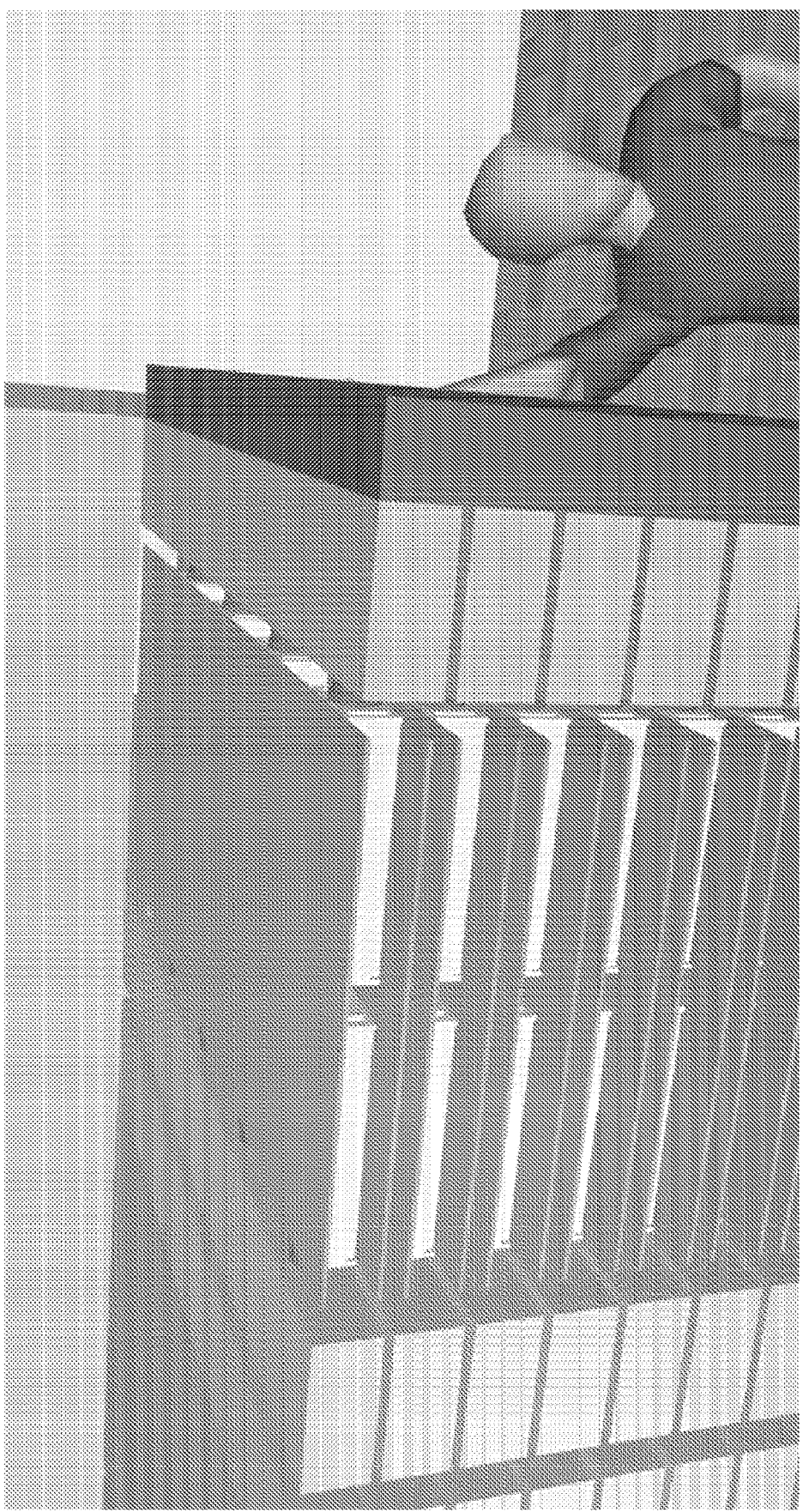
Figure 28:
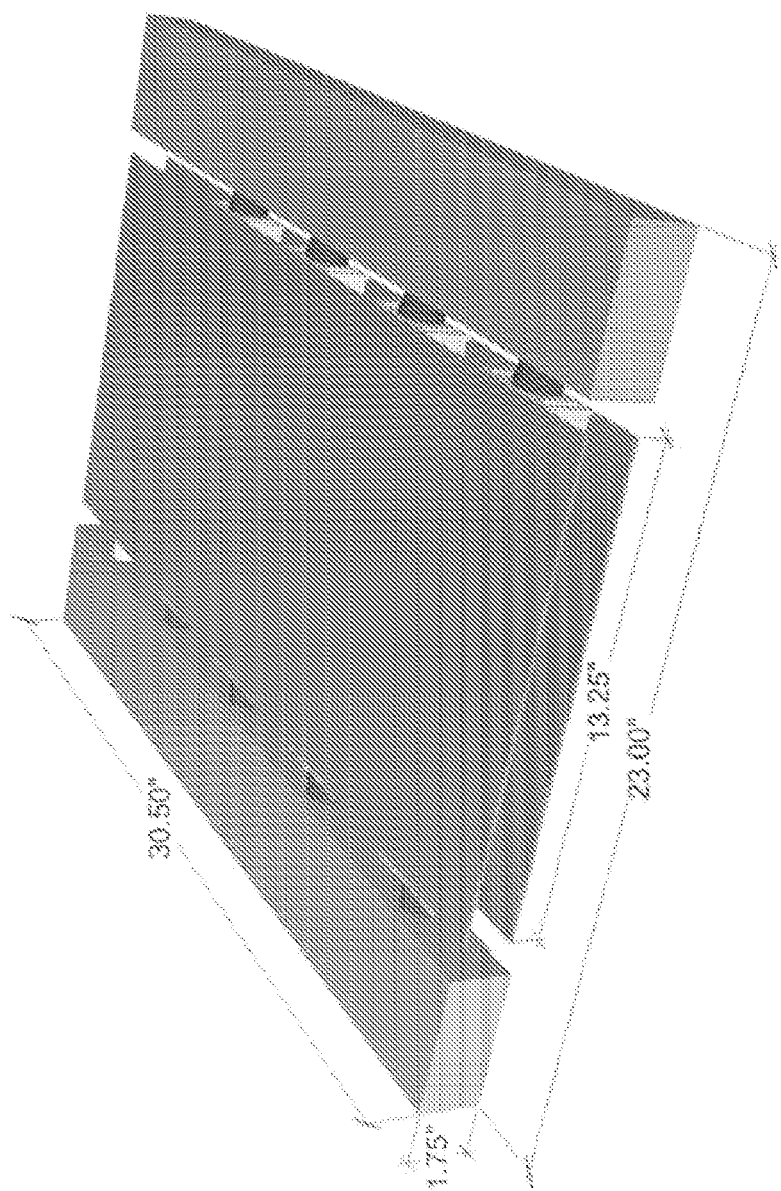
Figure 29:
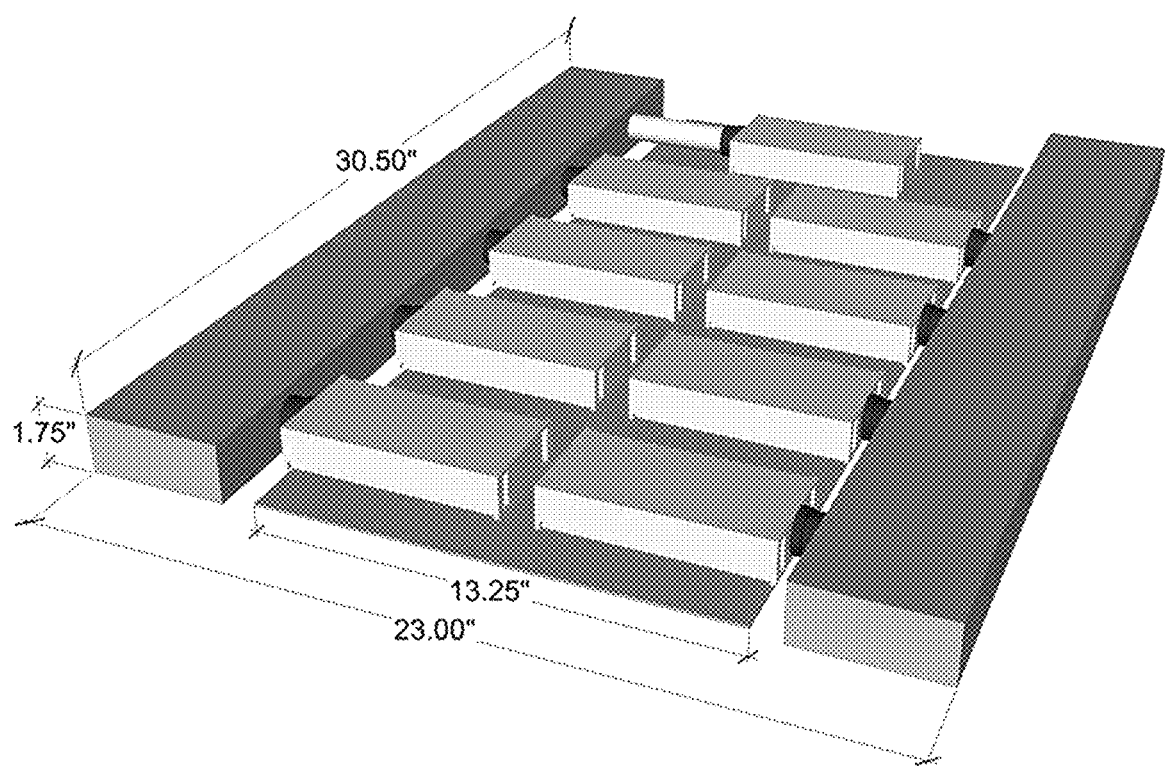
Figure 30:
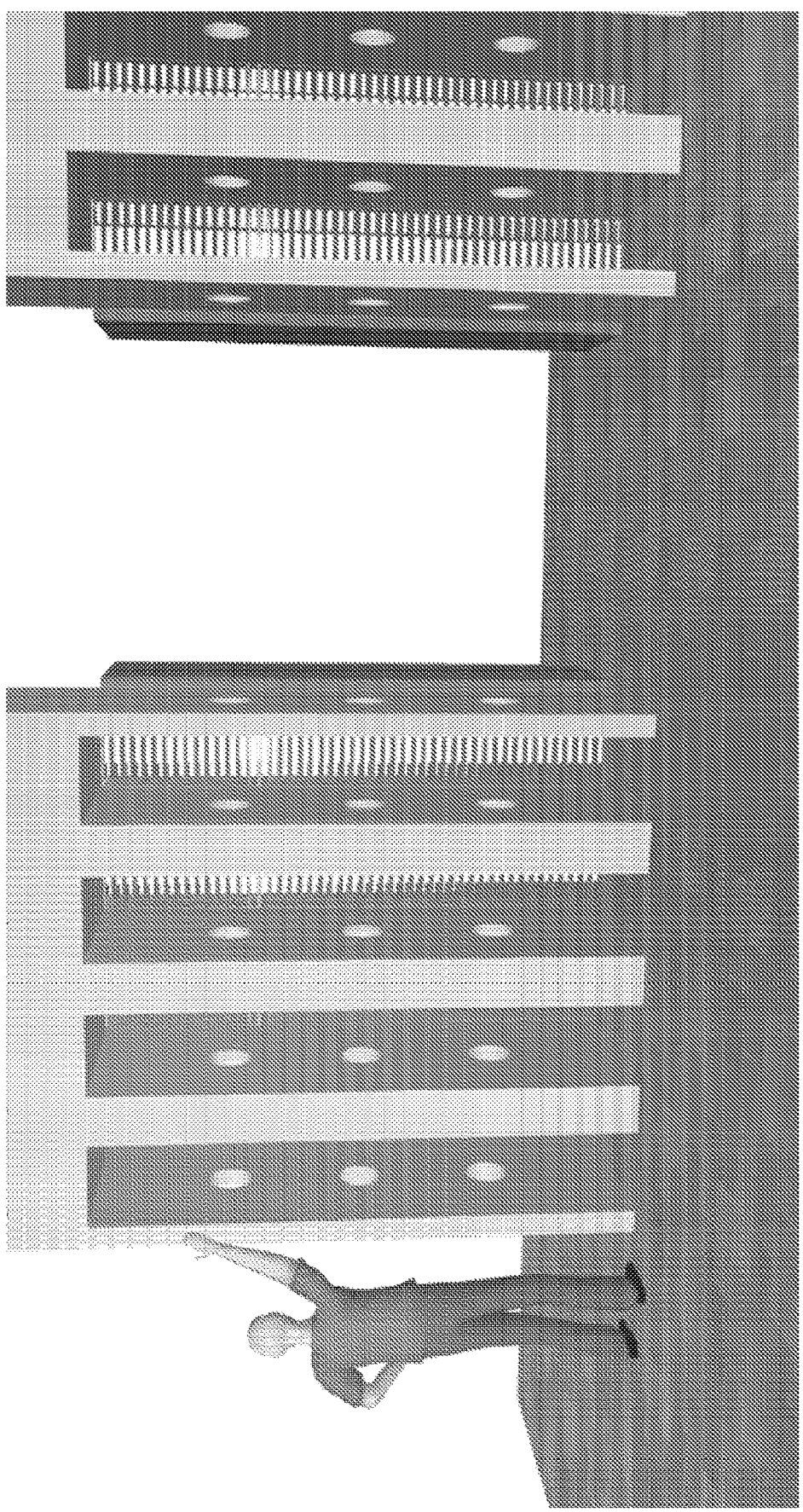
Figure 31:
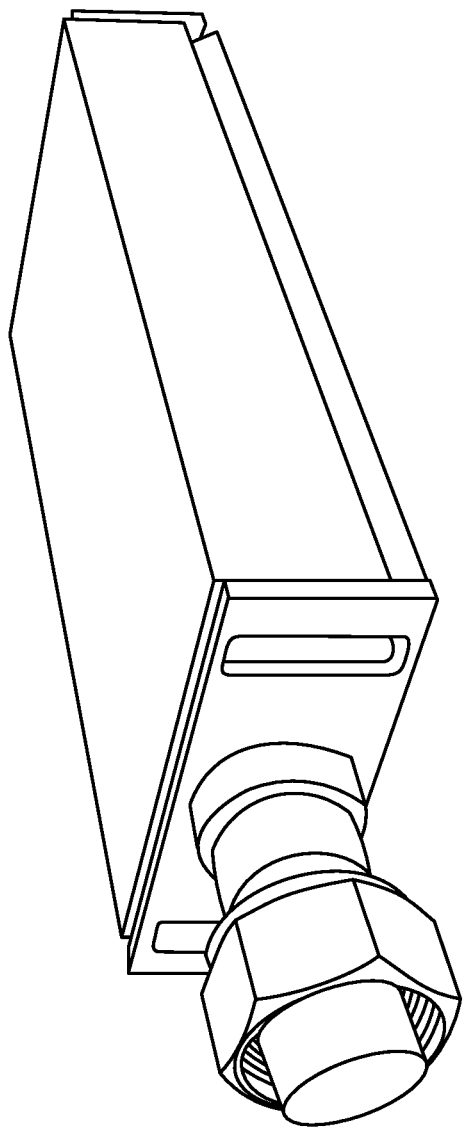
Figure 32:
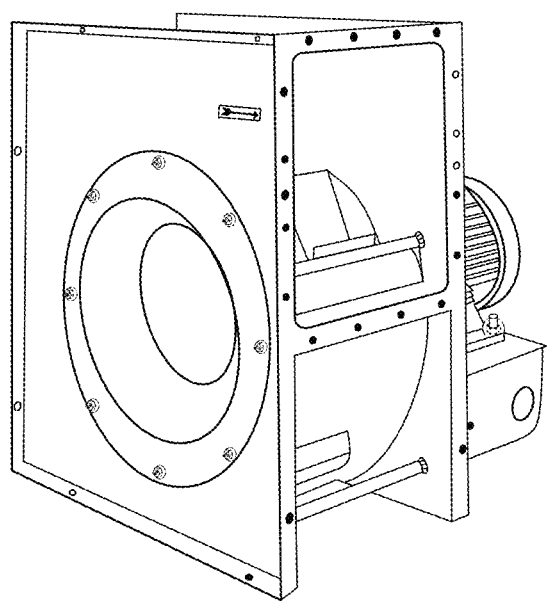

Consistent with the current disclosure, sheet 1700 in FIG. 17 is understood to extend in they-direction (to the right in FIG. 17). FIG. 18 depicts a fold in sheet 1700 over spacer 1710-1. Again, sheet 1700 in FIG. 18 is understood to extend in the negative v-direction (to the left in FIG. 18). FIG. 19 depicts the combination of FIG. 18 with an additional spacer 1710-2, configured to present a wedge shape with the "highest" portion aligned with the "lowest" portion of spacer 1710-1 (and vice versa). Similar to spacer 1710-1, the spacer 1710-2 can be configured to exhibit a "height" in the z-direction that is less than approximately 0.5 mm, such as any value between approximately 0.5 mm and approximately 0.010 mm (and preferably approximately 0.254 mm), or any value less than approximately 0.01 mm. Alternatively, the "height" in the z-direction of spacer 1710-2 can be less than approximately any one of the values: 0.45 mm, 0.4 mm, 0.39 mm, 0.38 mm, 0.37 mm, 0.36 mm, 0.35 mm, 0.34 mm, 0.33 mm, 0.32 mm, 0.31 mm, 0.3 mm, 0.29 mm, 0.28 mm, 0.27 mm, 0.26 mm, 0.25 mm, 0.24 mm, 0.23 mm, 0.22 mm, 0.21 mm, 0.2 mm, 0.19 mm, 0.18 Min, 0.17 mm, 0.16 mm, 0.15 mm, 0.14 mm, 0.13 mm, 0.12 mm, 0.11 mm, 0.1 mm, 0.09 mm, 0.08 mm, 0.07 mm, 0.06 mm, 0.05 mm, 0.04 mm, 0.03 mm, 0.02 mm, and 0.01 mm. FIG. 20 depicts the combination of FIG. 19 with an additional fold in sheet 1700 over spacer 1710-2. Again, sheet 1700 in FIG. 20 is understood to extend in the y-direction (to the right in FIG. 20). FIG. 21 depicts the combination of FIG. 20 with an additional spacer 1710-3, configured to present a wedge shape with the "highest" portion aligned with the "lowest" portion of spacer 1710-2 (and vice versa). FIG. 22 depicts the combination of FIG. 21 with five more folds, and four more spacers 1710, with each successive spacer 1710 aligned in an alternating sequence. Each successive spacer 1710 is understood to exhibit a height in the z-direction that can be less than approximately any one of the values: 0.45 mm, 0.4 mm, 0.39 mm, 0.38 mm, 0.37 mm, 0.36 mm, 0.35 mm, 0.34 mm, 0.33 mm, 0.32 mm, 0.31 mm, 0.3 mm, 0.29 mm, 0.28 mm, 0.27 mm, 0.26 mm, 0.25 mm, 0.24 mm, 0.23 mm, 0.22 mm, 0.21 mm, 0.2 mm, 0.19 mm, 0.18 mm, 0.17 mm, 0.16 mm, 0.15 mm, 0.14 mm, 0.13 mm, 0.12 mm, 0.11 mm, 0.1 mm, 0.09 mm, 0.08 mm, 0.07 mm, 0.06 mm, 0.05 mm, 0.04 mm, 0.03 mm, 0.02 mm, and 0.01 mm. In an embodiment, each successive spacer 1710 is configured to approximately (or exactly) match the dimensions of every other spacer 1710. In addition, in an embodiment, the sequence of successive spacers 1710 is configured to stack together so as to extend, approximately uniformly, into a z-direction for example as depicted in FIG. 25 as combination 2510. However, one of ordinary skill in the art would appreciate that other combinations and sequences of heights are possible.

Figure 23:
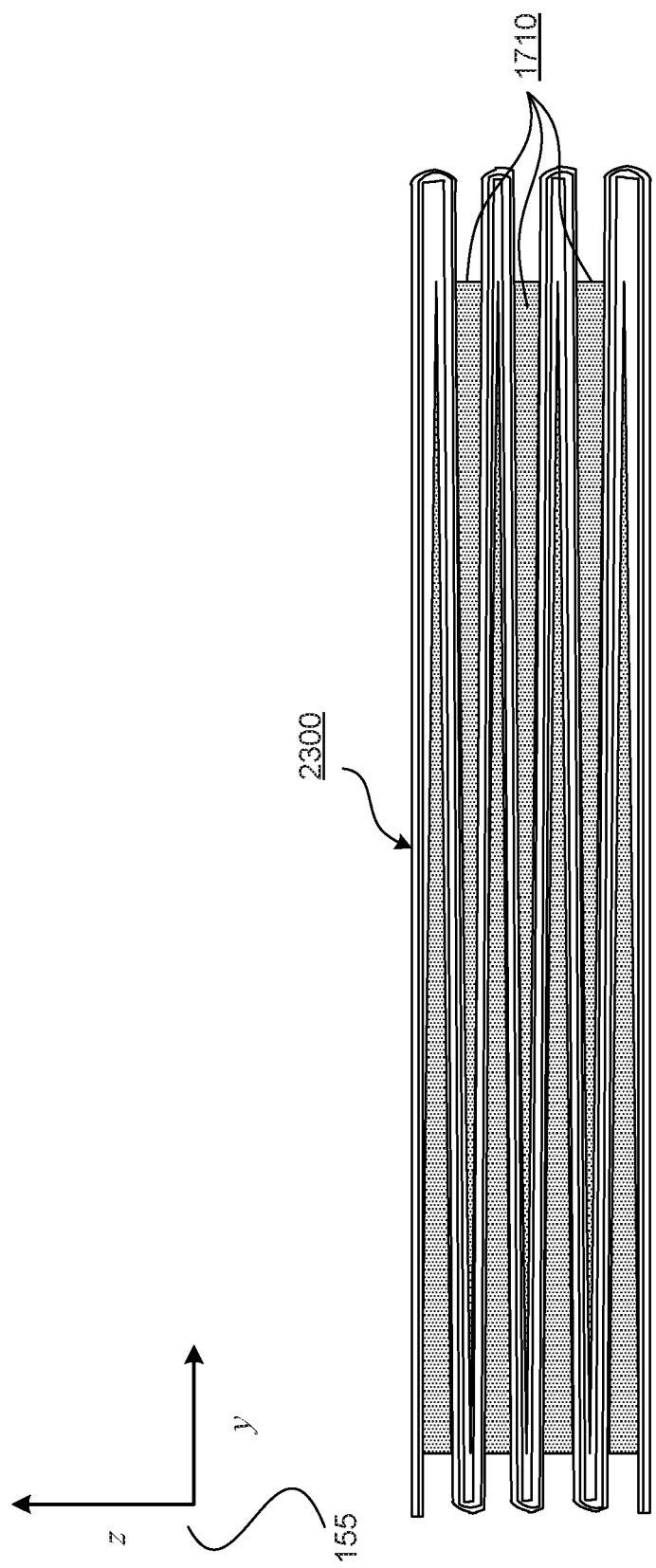
FIG. 23 depicts a side view of the combination of FIG. 22, in which the folded exemplary sheet and alternating spacer combination is compressed.
Figure 24:
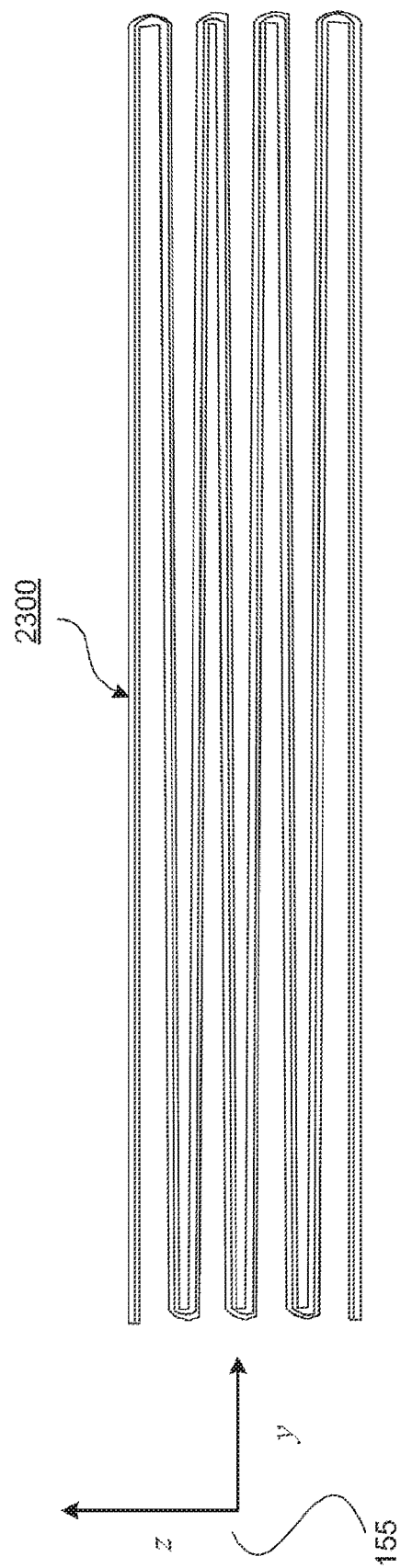
FIG. 24 depicts the combination of FIG. 23 consistent with the current disclosure, wherein the alternating spacers have been a melted, dissolved, or otherwise removed to provide channels.

Consistent with an embodiment, FIG. 23 depicts the combination of FIG. 22 with substantial pressure applied to the combination (the example, in the z-direction, applied uniformly across a x-v plane) so as to substantially close and/or otherwise reduce gaps between the folded sheet 2300 and the spacers 1710. FIG. 24 depicts the combination of FIG. 2,3 without the spacers 1710. The spacers 1710 can be removed by applying heat to the combination (such as baking the combination in an oven) where the spacers are manufactured using hard machinable wax or a thermoplastic, such as: PMMA air high-density polyethylene. Alternatively, or in addition, spacers 1710 can be removed through a chemical process—such as by dissolving spacers constructed of PMMA with dichloromethane or trichloromethane.

As depicted in FIG. 24, the resulting folded sheet 2300 can be configured to exhibit small (less than 0.5 mm) triangular gaps with alternating orientation, such that the channels are prismatic. One of ordinary skill in the art should appreciate that folded sheet 2300 alone, or in combination with other similarly configured folded sheets, can be grouped together as previously described in connection with stacks 600 and 900, in order to be incorporated into an enclosure 1050.

Additional, and further, details, discussion and disclosure are provided in Appendix A to this disclosure—the contents of which are fully incorporated herein by reference. For avoidance of doubt, the term "blade" as used in the attached Appendix A would be understood by one of ordinary skill in the art to refer to a conventional "server blade" as used in the context of computer server systems (such as supercomputing server blades). The term "blade" as used in the Appendix A does not refer to the "blade 200" as depicted and described herein.

Other embodiments will be apparent to those skilled in the art from consideration of the specification and practice of the embodiments disclosed herein. It is intended that the specification and examples be considered as exemplary only, with a true scope and spirit of the invention being indicated by the following claims.

Appendix A

Forced Physics

*A New Kind of Air*
*A New Way to Cool*

Structured Air Technology | Products | Applications | Gallery | Contact | Search

Structured Air Technology

Forced Physics has developed and patented cooling devices that structure the mass and kinetic energy of air at the molecular level. Structured air has a higher specific heat and removes heat from a surface faster than regular unstructured air.

In supercomputers, high density is the key to performance. Structured air technology allows supercomputers to be built with 4 times the density achievable with chilled-water cooling.

The extreme energy efficiency of structured air technology will also lower your power bill.

The Benefits Of Structured Air Cooling

| | |
|---|---|
| Higher Performance | 74% More FLOPS per node. Allows Speedup Without the software/modeling expense of scale out. |
| Lower System Price | 75.8% more FLOPS per purchasing $. |
| Lower Power Costs | 190.2% more FLOPS per W (including Cooling). |
| Less Floor Space | 596% more FLOPS per square foot. |
| Lower TCO | 85% more FLOPS per TCO $. |

Forced Physics

A New Kind of Air
A New Way to Cool

Structured Air Technology | Products | Applications | Gallery | Contact          Search

The Katalina Cooler Model 6

The Model 6 is an extraordinarily powerful heat extraction device with a cooling capacity and form factor that fits supercomputer CPU, GPU, and network processors. See our Applications page for details about how the Model 6 allows for new architectures with higher performance and efficiency.

To use a Model 6, simply connect and seal a fan or blower input to the exhaust tube. The blower can be adjacent to the Model 6 or connected by duct. The hot exhaust can be directed out of the building or used for space heating. The electronics to be cooled should be firmly clamped to the top, bottom, or sides of the Model 6. Allow at least 0.5 inches of clearance on either end of the device for air to reach the intake openings.

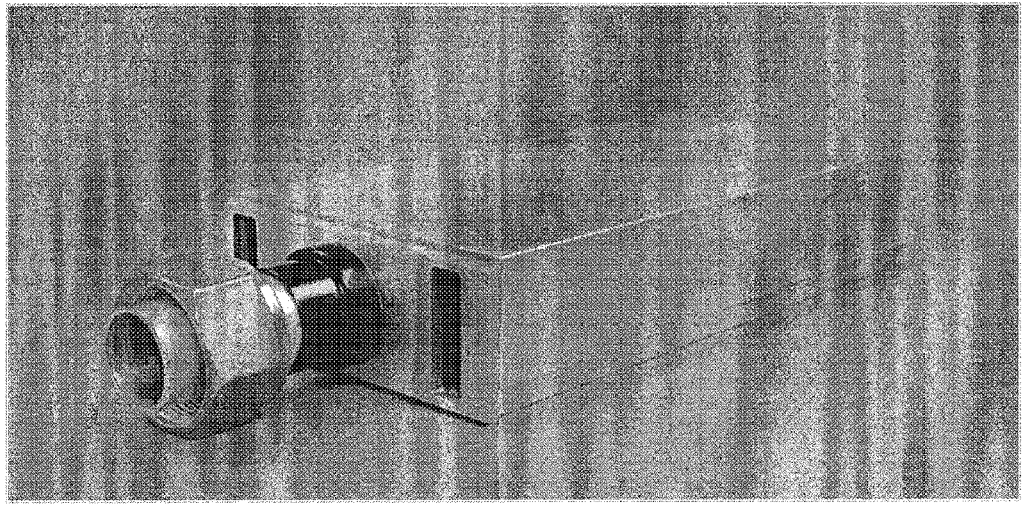

Physical Specifications

| | | |
|---|---|---|
| Length | 6.2" | 157 mm |
| Width | 3.125" | 79.4 mm |
| Height | 1.25" | 31.8 mm |
| Exhaust Tube OD | 0.75" | 19 mm |
| Mass | 30.6 oz | 867 g |

Model 6 Performance Range At DT=75°C

Products - Forced Physics

| Test Case | | A | B | C | D | E | F | G | H | I | J |
|---|---|---|---|---|---|---|---|---|---|---|---|
| Differential Pressure | mbar | 2.5 | 3.6 | 7.5 | 12.4 | 14.9 | 16.5 | 41.0 | 49.5 | 93.6 | 118.7 |
| Flow Rate Estimate | CFM | 1.3 | 2.0 | 4 | 6.6 | 8.0 | 8.9 | 22.0 | 26.6 | 50.2 | 63.7 |
| Air Moving Energy | W | 0.2 | 0.3 | 1.4 | 3.9 | 5.7 | 7.0 | 43.1 | 62.8 | 224.5 | 361.2 |
| Fan Efficiency | % | 70.0 | 70.0 | 70.0 | 70.0 | 70.0 | 70.0 | 70.0 | 70.0 | 70.0 | 70.0 |
| Fan Power | W | 0.2 | 0.5 | 2.0 | 5.6 | 8.2 | 10.0 | 61.6 | 89.7 | 320.8 | 516.1 |
| DeltaT | °C | 75.0 | 75.0 | 75.0 | 75.0 | 75.0 | 75.0 | 75.0 | 75.0 | 75.0 | 75.0 |
| Total Dissipation | W | 215.4 | 249.3 | 325.1 | 382.6 | 401.7 | 414.1 | 514.1 | 533.4 | 594.5 | 616.4 |
| Extraction to Exhaust | W | 137.0 | 170.9 | 246.7 | 305.4 | 325.5 | 337.9 | 434.8 | 454.1 | 515.1 | 536.7 |
| Dissipation to Surroundings | W | 78.4 | 78.4 | 78.4 | 77.2 | 76.2 | 76.2 | 79.4 | 79.4 | 79.4 | 79.7 |
| Extraction to Exhaust COP | | 598.0 | 352.8 | 121.1 | 54.5 | 39.9 | 33.7 | 7.1 | 5.1 | 1.6 | 1.0 |
| Total Dissipation COP | | 940.3 | 514.7 | 159.6 | 68.3 | 49.3 | 41.3 | 8.3 | 5.9 | 1.9 | 1.2 |

Applications - Forced Physics                                                              Page 1 of 5

Forced Physics                                                          A New Kind of Air
                                                                            A New Way to Cool Structured Air Technology   Products   Applications   Gallery   Contact                Search

Extreme Density, Efficiency, Performance, And Economy

Supercomputers that use the Model 6 structured-air cooling system will be denser, faster, more energy efficient, and more economical than anything on the market today. To quantify the benefits of the Model 6, we compare two projected supercomputer systems with Dragonfly networking and the same number of 200W Intel Knight's Landing nodes:

1. The Conventional system is an instance of the leading chilled-water cooled supercomputer with 8 nodes per blade and 16 blades in each chassis.
2. The new FP Architecture uses Model 6 cooling with the same blades as the Conventional system. The extremely high heat transfer rate and small size of the Model 6 makes it possible to have 64 blades in each chassis.

Comparison Of Two 6,144-Node Supercomputers

|  |  | Conventional Chilled-Water | FP Architecture Model 6 | Improvement |
|---|---|---|---|---|
| Structure | Total Nodes | 6,144 | 6,144 |  |
|  | Number of Communication Processors | 768 | 768 |  |
|  | Number of Heat Sink/Model 6 Coolers | 6,912 | 3,456 |  |
|  | Nodes Per Blade | 8 | 8 |  |
|  | Number of Blades | 768 | 768 |  |
|  | Number of Blades Per Chassis | 16 | 64 | 300.0% |
|  | Number of Chassis | 48 | 12 | 75.0% |
|  | Nodes Per Chassis | 128 | 512 | 300.0% |
|  | Number of Compute Cabinets | 16 | 4 | 75.0% |
|  | Floor Space (sq ft) at 23 sq ft per cabinet | 368 | 92 | 75.0% |
|  | Nodes Per Electrical Group | 768 | 3,072 | 300.0% |
|  | Number of Electrical Groups | 8 | 2 | 75.0% |
|  | Electrical of Group Pairs to Interconnect | 28 | 1 | 96.4% |
|  | Chassis Pairs to Interconnect in Electrical Groups | 120 | 30 | 75.0% |
|  | Blade Pairs to Interconnect in Chassis | 5,760 | 24,192 | 320.0% |
|  | Optical Interconnects in Full Dragonfly Network | 21,504 | 3,072 | 85.7% |
| Communication Load | Relative Electrical Group Communication Load | 1.00 | 0.26 | 74.0% |
|  | Relative Chassis Communication Load | 1.00 | 0.49 | 51.1% |
|  | Relative Blade Communication Load | 1.00 | 1.00 |  |
|  | Power Per Node (W) | 200 | 200 |  |
|  | Power Per Communication Processor (W) | 200 | 200 |  |
|  | Power Per Blade (W) | 1,800 | 1,800 |  |
|  | Total System Blade Power (kW) | 1,382 | 1,382 |  |
|  | Total System Cabinet Blower Power (kW) | 96 | 0 | 100.0% |

Applications - Forced Physics

How The Model 6 Improves Compute Performance

Supercomputers are built specifically to address problems whose solutions require massive amounts of communication between compute nodes. To reach maximum performance (peak FLOPS), supercomputers must have an internal communication network that keeps the compute nodes fully utilized. In practice, measured FLOPS are lower than peak FLOPS because compute nodes are often waiting for transmissions. This performance cost can easily be seen in the 2013 TOP 500 list, where the top performer only achieved of 62% peak FLOPS on the LINPACK benchmark used for that ranking.

The power consumed by a temporarily idle processor is nearly as high as an active one, so a machine with 38% idle processors is not just wasting time: it is wasting 38% of the compute power and 38% of the associated cooling costs. When you add those costs to the direct power and cooling cost of the communication transmissions, it is easy to see that the communication network is crucial for delivering both peak FLOPS and high FLOPS/W efficiency.

Communication Groups

The compute nodes of a supercomputer are organized into a hierarchy of groupings with different types of communication paths at each level. The set of nodes on each blade has a relatively short and very fast board-level electrical communication path. The set of blades in each chassis has an electrical communication path that is longer and therefore somewhat slower and more power-hungry. The set of chassis in a two-cabinet electrical group also uses an electrical path for communication, but the wires are longer, slower, and even more power-hungry. Finally, the electrical groups of a supercomputer communicate via optical links, which are the longest, slowest, most power-hungry, and also the most expensive.

Communication Load

Many supercomputer applications work by dividing a simulated space among the nodes. In a molecular dynamics simulation, for example, a volume of space is divided into subspaces and the motions of molecules in each subspace are tracked by a node. Whenever a molecule crosses a subspace boundary, the crossing must be communicated to the node tracking the adjacent subspace. For any subspace, the frequency of crossings and corresponding communications scales with the surface area of the subspace. The same scaling rule applies for the larger spaces represented by groups of nodes: the frequency of crossings and corresponding communications scales with the surface area of the group's combined space.

Surface area scales with the cube root of the square of the volume, so for a collection of $S$ nodes divided into groups of size $N$, the total group communication load is $$(S/N)N^{2/3} - S^{2/3}.$$

Although this scaling relation has no units, it is very useful for comparing the relative communication burden between communication groups of different size.

Bigger Is Better For Communication Groups

Suppose, for example, that you have 3072 nodes to divide into communication groups. The communication loads for a variety of group sizes are provided below.

Applications - Forced Physics

| Blade Group Size (Number of Nodes) | Communication Load |
|---|---|
| 4 | 1,724 |
| 8 | 1,325 |

| Chassis Group Size (Number of Nodes) | Communication Load |
|---|---|
| 64 | 557 |
| 128 | 398 |
| 512 | 173 |

| Electrical Group Size (Number of Nodes) | Communication Load |
|---|---|
| 768 | 124 |
| 1,536 | 55 |
| 3,072 | 0 |

It is clear that communication loads go down dramatically as group node density increases. When all of the nodes are in one electrical group, the communication load between electrical groups goes to zero.

Lower Communication Loads Mean Faster Results

Molecular dynamics simulations have been reported to run at 50% CPU utilization on a simulated IBM supercomputer (see "BigSim: A Parallel Simulator for Performance Prediction of Extremely Large Parallel Machines", Zeng et al, IPDPS '14). Half the run time, therefore, is used communicating between timesteps. The delay between bursts of processor activity is determined by the slowest communication on optical connections between electrical groups that must occur before the next timestep. The FP Architecture reduces the electrical group communication load by 74%.

Half of the time in each step is used for communication, so the overall run time for the step is decreased by 37% (half of 74%). With the FP Architecture, a step that would otherwise take 1 second now requires only 0.63 seconds, so the FP has a speedup factor of 1 / 0.63 = 1.587.

Summary Of Performance Benefits

When communication groups have higher node density, the result is

- lower communication loads,
- higher processor utilization,
- higher computational performance,
- less power wasted on idle processors,
- less time wasted on high-latency communications,
- less power wasted on longer communications, and
- more FLOPS/W.

The Economics Of The Model 6

How The Model 6 Cuts Energy Costs

Current electronics cooling systems move heat into the air or else into a water loop. The heat moved to the air or water must then be moved through a chiller/HVAC system to get to the outside of the building. The Model 6 is different in that it moves heat into an air stream that is blown directly out of the building. Consequently, that heat does not need need a chiller/HVAC system to move it out of the building. The Model 6 has a much higher COP (coefficient of performance) than the chillers it replaces, and the difference means that systems with the Model 6 will use much less energy for cooling.

How The Model 6 Cuts Building Capitalization Costs

Applications - Forced Physics

The Uptime Institute white paper entitled "Cost Model: Dollars per kW plus Dollars per Square Foot of Computer Floor" provides a cost model for capitalizing data center buildings. Their model computes the cost as the sum of a floor space cost and a second component that scales with the power of the computers in the building. The cost of empty floor space is put at $300 per square foot. The cost of power/cooling infrastructure at Tier 4 is $25,000 per kW.

Scaling Out To 100 PFLOPS

The efficiency of the 8X architecture makes 100 PFLOPS much more practical. Here are the numbers for two systems with the same number of nodes. Only the FP achieves 110 PFLOPS. The current chilled-water architecture only achieves 73 PFLOPS and it requires 10MW more power. The FP achieves 142.5% more FLOPS/W.

Comparison Of Two 49,152-Node Supercomputers

| | | Conventional Chilled-Water | FP Architecture Model 6 | Improvement |
|---|---|---|---|---|
| Structure | Total Nodes | 49,152 | 49,152 | |
| | Number of Communication Processors | 6,144 | 6,144 | |
| | Number of Heat Sink/Model 6 Coolers | 55,296 | 27,648 | |
| | Nodes Per Blade | 8 | 8 | |
| | Number of Blades | 6,144 | 6,144 | |
| | Number of Blades Per Chassis | 16 | 64 | 300.0% |
| | Number of Chassis | 384 | 96 | 75.0% |
| | Nodes Per Chassis | 128 | 512 | 300.0% |
| | Number of Compute Cabinets | 128 | 32 | 75.0% |
| | Floor Space (sq ft) at 23 sq ft per cabinet | 2,944 | 736 | 75.0% |
| | Nodes Per Electrical Group | 768 | 3,072 | 300.0% |
| | Number of Electrical Groups | 64 | 16 | 75.0% |
| | Electrical of Group Pairs to Interconnect | 2,016 | 120 | 94.0% |
| | Chassis Pairs to Interconnect in Electrical Groups | 960 | 240 | 75.0% |
| | Blade Pairs to Interconnect in Chassis | 46,080 | 193,536 | 320.0% |
| | Optical Interconnects in Full Dragonfly Network | 1,548,288 | 368,640 | 76.2% |
| Communication Load | Relative Electrical Group Communication Load | 1.00 | 0.51 | 49.3% |
| | Relative Chassis Communication Load | 1.00 | 0.57 | 42.9% |
| | Relative Blade Communication Load | 1.00 | 1.00 | |
| Power | Power Per Node (W) | 200 | 200 | |
| | Power Per Communication Processor (W) | 200 | 200 | |
| | Power Per Blade (W) | 1,800 | 1,800 | |
| | Total System Blade Power (kW) | 11,059 | 11,059 | |
| | Total System Cabinet Blower Power (kW) | 768 | 0 | 100.0% |
| | Total PDU Waste Power (kW) | 1,183 | 1,106 | 6.5% |
| | Heat Removed Per Model 6 (W) | NA | 326 | |
| | Total Heat Removed by Model 6 Units (kW) | NA | 9,000 | |
| | Exhaust Power Per Model 6 (W) | NA | 8.15 | |
| | Total Exhaust Power Required (kW) | NA | 225.39 | |
| | Chiller/HVAC COP | 1.00 | 1.00 | |
| | Total Chiller/HVAC Power Required (kW) | 13,010 | 402 | 96.9% |
| | Total Cooling Power Required (kW) | 13,778 | 627 | 95.4% |
| | Total Compute Power Required (kW) | 12,242 | 12,165 | 0.6% |

What is claimed is:

1. An assembly for cooling comprising:
a folded sheet;
wherein the folded sheet exhibits a beveled edge, at least a first fold, and at least a second fold;
wherein the first fold and a first portion of the beveled edge form a portion of a perimeter to a first region;
wherein the first fold, a second portion of the beveled edge, and the second fold form a portion of a perimeter to a second region, and wherein the first portion of the beveled edge is continuous with the second portion of the beveled edge;
wherein the second fold and a third portion of the beveled edge form a portion of a perimeter to a third region, and wherein the second portion of the beveled edge is continuous with the third portion of the beveled edge;
wherein the first region of the folded sheet is substantially flat, the second region of the folded sheet is substantially flat, and the third region of the folded sheet is substantially flat;
wherein the first fold is separated from the second fold by approximately a first distance;
wherein the first fold is configured to present approximately a first non-zero acute angle between the first portion of the beveled edge and the second portion of the beveled edge such that the second fold is elevated from the substantially flat first region by a value that is less than approximately one of a set of values consisting of: 0.5 mm, 0.45 mm, 0.4 mm, 0.39 mm, 0.38 mm, 0.37 mm 0.36 mm, 0.35 mm, 0.34 mm, 0.33 mm, 0.32 mm, 0.31 mm, 0.3 mm, 0.29 mm, 0.28 mm, 0.27 mm 0.26 mm, 0.25 mm, 0.24 mm, 0.23 mm, 0.22 mm, 0.21 mm, 0.2 mm, 0.19 mm, 0.18 mm, 0.17 mm 0.16 mm, 0.15 mm, 0.14 mm, 0.13 mm, 0.12 mm, 0.11 mm, 0.1 mm, 0.09 mm, 0.08 mm, 0.07 mm 0.06 mm, 0.05 mm, 0.04 mm, 0.03 mm, 0.02 mm, and 0.01 mm;
wherein the second fold is configured to present approximately a second non-zero acute angle between the third portion of the beveled edge and the second portion of the beveled edge such that the second non-zero acute angle is approximately the first non-zero acute angle;
wherein the folded sheet is configured to present a series of channels for a flow of gas.

2. The assembly of claim 1 wherein the gas comprises air.

3. The assembly of claim 1 wherein the folded sheet exhibits at least a second beveled edge, the second beveled edge being approximately parallel to the beveled edge.

4. The assembly of claim 1 wherein the second fold is elevated from the substantially flat first region by less than approximately 0.254 mm, the first distance is approximately 24 mm, and a largest thickness of the beveled edge is approximately 0.178 mm.

5. The assembly of claim 4 wherein the folded sheet comprises a material selected from a set of materials consisting of: copper, aluminum, silver, gold, tin, brass, bronze, steel, and anodized aluminum.

6. The assembly of claim 5 wherein the material is copper.

7. The assembly of claim 6 wherein the folded sheet includes at least 50 folds.

8. A method for forming the assembly of claim 1, comprising:
providing a sheet for folding, wherein the sheet exhibits a beveled edge, a first face, and a second face, the second face being on an opposite side of the sheet from the first face;
providing a plurality of spacers, each spacer configured to exhibit a substantially rectangular first face and a substantially rectangular second face, the substantially rectangular second face defining a second plane that is at a non-zero acute angle to a first plane defined by the substantially rectangular first face, each spacer further configured to present a wedge-like cross-section along an axis parallel to a surface of the first plane and a surface of the second plane, each spacer further configured to exhibit an edge defined by an intersection of the substantially rectangular first face with the substantially rectangular second face;
placing at least a first spacer from said plurality of spacers adjacent to the sheet such that at least a portion of the first face of the first spacer is flush with a first portion of the first face of the sheet;
forming the first fold in the sheet along the edge of the first spacer, wherein the first fold is configured to place a second portion of the first face of the sheet flush with at least a portion of the second face of the first spacer;
placing at least a second spacer from said plurality of spacers adjacent to the sheet such that at least a portion of the second face of the second spacer is flush with a first portion of the second face of the sheet, the first portion of the second face of the sheet being on the opposite side of the second portion of the first face of the sheet, wherein the edge of the second spacer is substantially parallel to the edge of the first spacer and separated by a first distance;
forming the second fold in the sheet along the edge of the second spacer to form the folded sheet, wherein the second fold is configured to place a second portion of the second face of the sheet flush with at least a portion of the first face of the second spacer; and
removing the first spacer and the second spacer from the folded sheet.

9. The method of claim 8 wherein the gas comprises air.

10. The method of claim 8 wherein the folded sheet exhibits at least a second beveled edge, the second beveled edge being approximately parallel to the beveled edge.

11. The method of claim 8 wherein the second fold is elevated from the substantially flat first region by less than approximately 0.254 mm, the first distance is approximately 24 mm, and a largest thickness of the beveled edge is approximately 0.178 mm.

12. The method of claim 11 wherein the folded sheet comprises a material selected from a set of materials consisting of: copper, aluminum, silver, gold, tin, brass, bronze, steel, and anodized aluminum.

13. The method of claim 12 wherein the material is copper.

14. The method of claim 13 wherein the folded sheet includes at least 50 folds.

15. The method of claim 8 further comprising, before removing the first spacer and the second spacer, compressing the folded sheet.

16. The method of claim 8 wherein removing the first spacer and the second spacer comprises: melting the first spacer and the second spacer.

17. The method of claim 8 wherein removing the first spacer and the second spacer comprises: dissolving the first spacer and the second spacer.

* * * * *